US012777712B2

(12) United States Patent
Niebojewski et al.

(10) Patent No.: US 12,777,712 B2
(45) Date of Patent: Oct. 27, 2026

(54) QUANTUM ELECTRONIC CIRCUIT AND METHOD FOR MANUFACTURING THE SAME

(71) Applicant: COMMISSARIAT À L'ENERGIE ATOMIQUE ET AUX ENERGIES ALTERNATIVES, Paris (FR)

(72) Inventors: Heimanu Niebojewski, Grenoble Cedex (FR); Benoit Bertrand, Grenoble Cedex (FR); Thomas Bedecarrats, Grenoble Cedex (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 329 days.

(21) Appl. No.: 18/612,438

(22) Filed: Mar. 21, 2024

(65) Prior Publication Data

US 2024/0321893 A1 Sep. 26, 2024

(30) Foreign Application Priority Data

Mar. 22, 2023 (FR) .................................... 2302705

(51) Int. Cl.
*H01L 27/12* (2006.01)
*H01L 21/84* (2006.01)
(Continued)

(52) U.S. Cl.
CPC ......... *H10D 86/201* (2025.01); *H10D 30/402* (2025.01); *H10D 48/383* (2025.01); *H10D 86/01* (2025.01)

(58) Field of Classification Search
CPC .. H10D 86/201; H10D 30/402; H10D 48/383; H10D 86/01; H10D 30/014;
(Continued)

(56) References Cited

U.S. PATENT DOCUMENTS

| | | | | |
|---|---|---|---|---|
| 2016/0268406 | A1 | 9/2016 | Barraud et al. | |
| 2018/0331108 | A1* | 11/2018 | Hutin | G06N 10/40 |
| 2023/0105807 | A1* | 4/2023 | Niebojewski | H10D 48/383 257/30 |

FOREIGN PATENT DOCUMENTS

| | | | |
|---|---|---|---|
| EP | 4 160 694 | A1 | 4/2023 |
| FR | 3 066 297 | A1 | 11/2018 |

(Continued)

OTHER PUBLICATIONS

Search Report as issued in French Patent Application No. FR2302705, dated Nov. 21, 2023.

(Continued)

*Primary Examiner* — Tong-Ho Kim

(74) *Attorney, Agent, or Firm* — CUSHMAN PARTNERS LLC

(57) ABSTRACT

One aspect of the invention relates to an electronic circuit (1) comprising:

- a semiconductor layer (2), referred to as "qubit layer";
- a separation layer (42) extending in contact with the qubit layer (2);
- first conductive electrodes (61), referred to as "coupling rows", extending in parallel to the qubit layer (2);
- second conductive electrodes (62), referred to as "coupling columns", extending in parallel to the qubit layer (2);
- third conductive electrodes (71), referred to as "control rows", extending over the spacer (42); and
- conductive vias (72), referred to as "control vias", extending perpendicularly to the face of the qubit layer (2) from the spacer (42) and having one end disposed in proximity to the qubit layer (2).

13 Claims, 16 Drawing Sheets

(51) Int. Cl.
*H10D 30/40* (2025.01)
*H10D 48/00* (2025.01)
*H10D 86/00* (2025.01)
*H10D 86/01* (2025.01)

(58) Field of Classification Search
CPC .. H10D 48/3835; H10D 64/27; H10D 62/122; H10D 62/118; G06N 10/40; B82Y 10/00
USPC .......................................................... 257/213
See application file for complete search history.

(56) References Cited

FOREIGN PATENT DOCUMENTS

| | | | |
|---|---|---|---|
| WO | WO 2021/194995 | A1 | 9/2021 |
| WO | WO 2023/277686 | A1 | 1/2023 |

OTHER PUBLICATIONS

Vinet, M., et al., "Towards scalable silicon quantum computing," 2018 IEEE International Electron Devices Meeting (IEDM), IEEE, Dec. 2018, XP033501023, 4 pages.
Veldhorst, M., et al., "Silicon CMOS architecture for a spin-based quantum computer, nature communications," (Year: 2017), pp. 1-8.
Li, R., et al., "A Crossbar Network for Silicon Quantum Dot Qubits," ARXIV.org, Retrieved from the Internet: URL: https://arxiv.org/abs/1711.03807, (Year: 2017), 24 pages.

* cited by examiner

[Fig. 1]
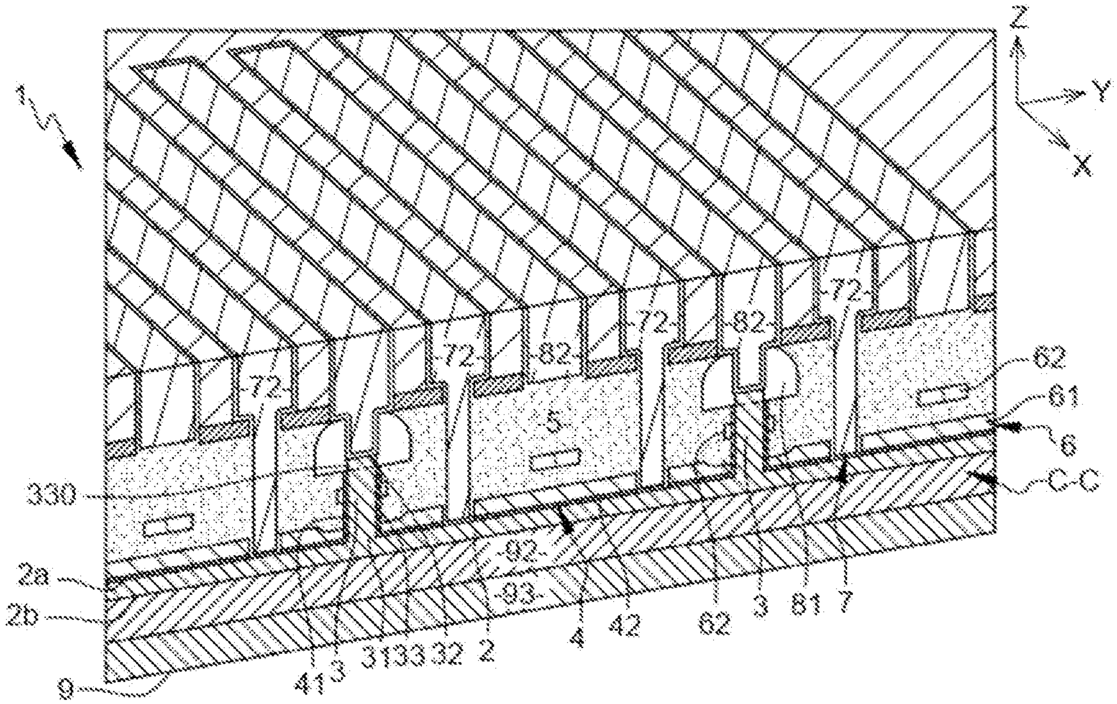
[Fig. 2]
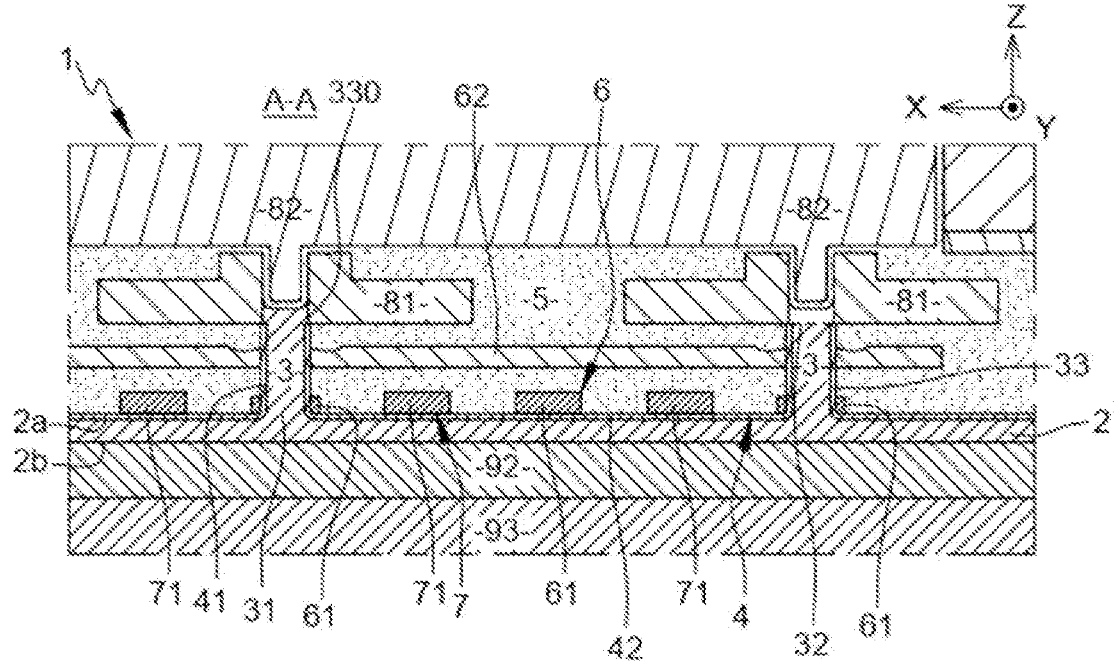

[Fig. 3]
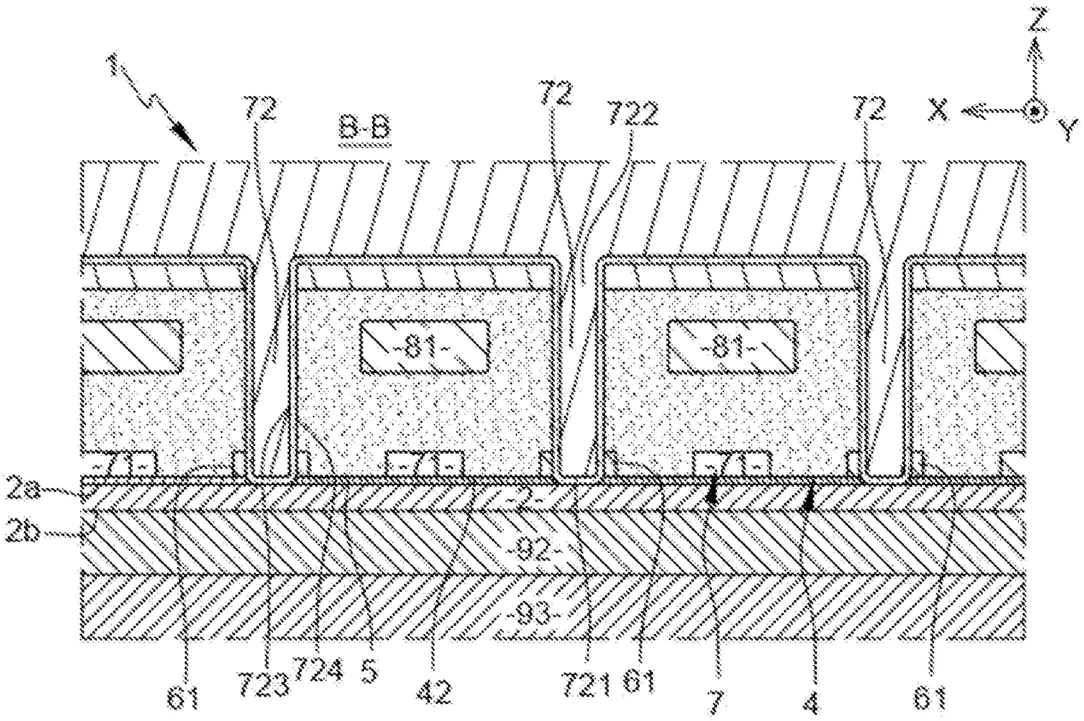

[Fig. 4]
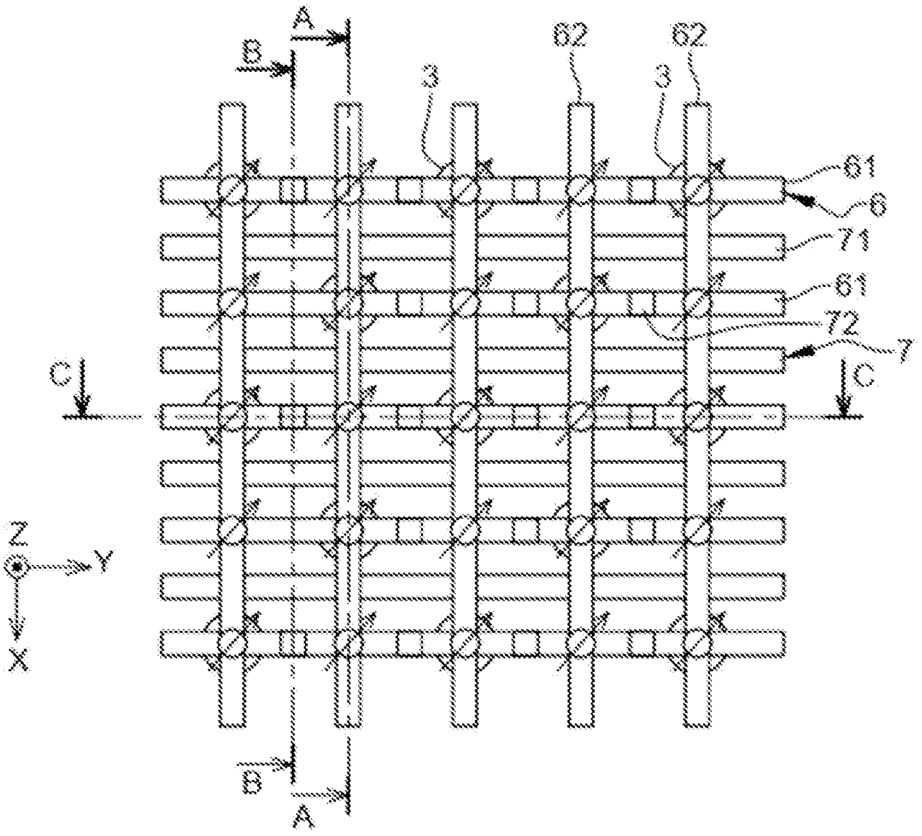
[Fig. 5]
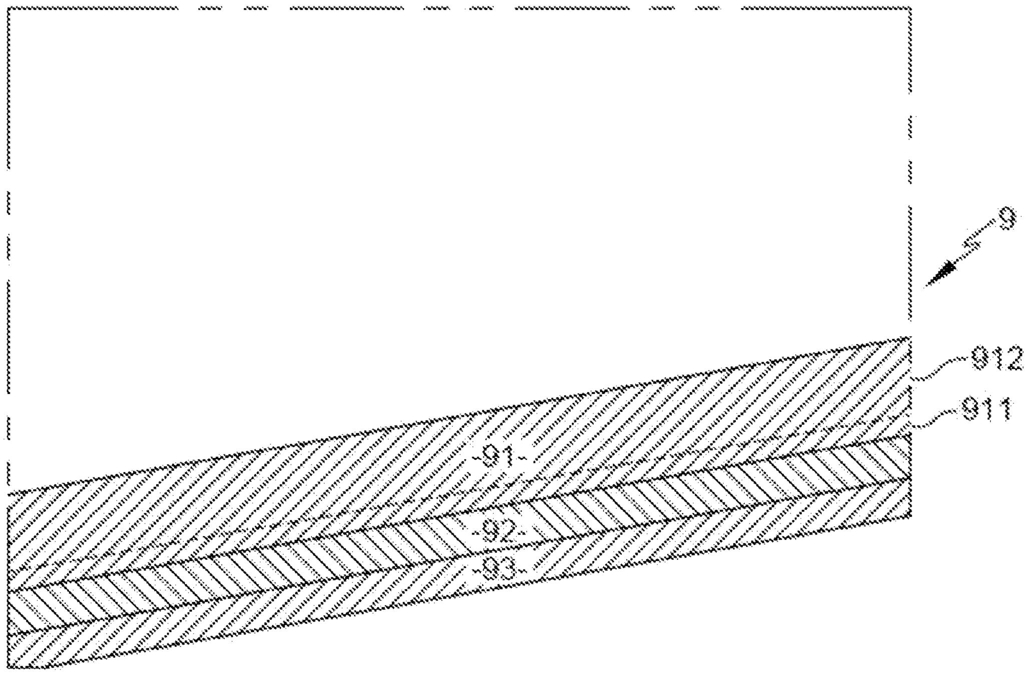

[Fig. 6]
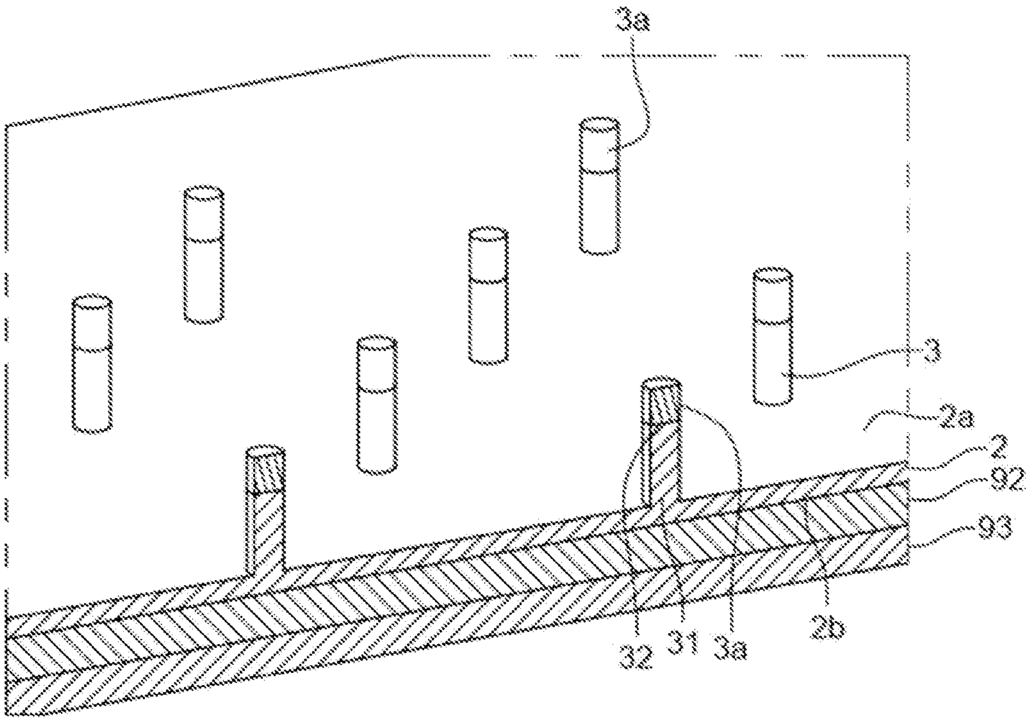
[Fig. 7]
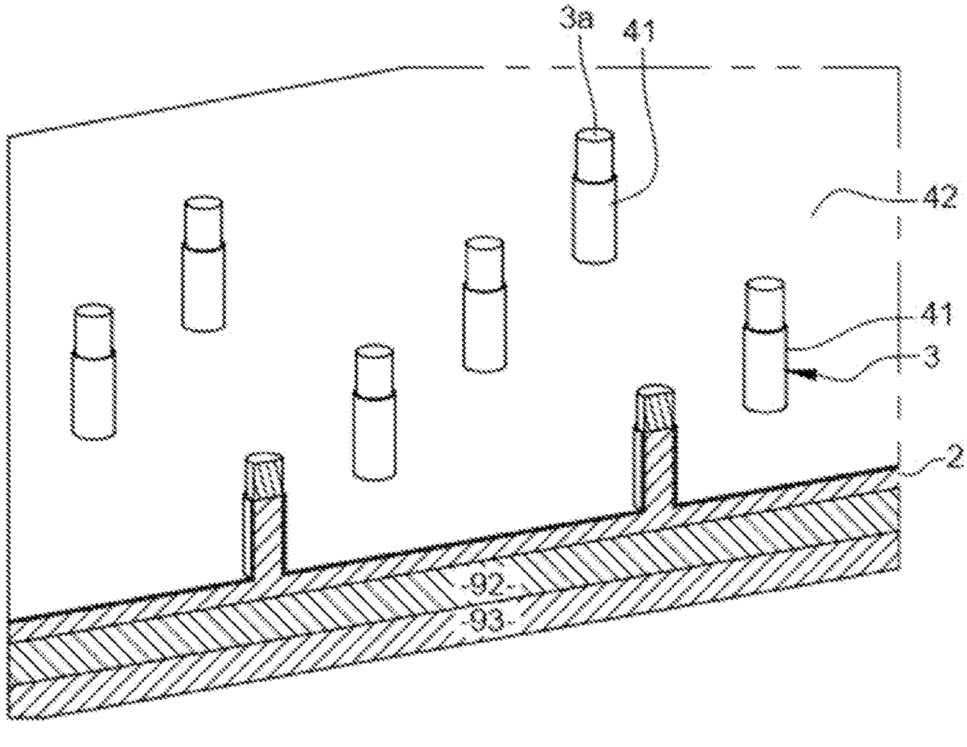

[Fig. 8]
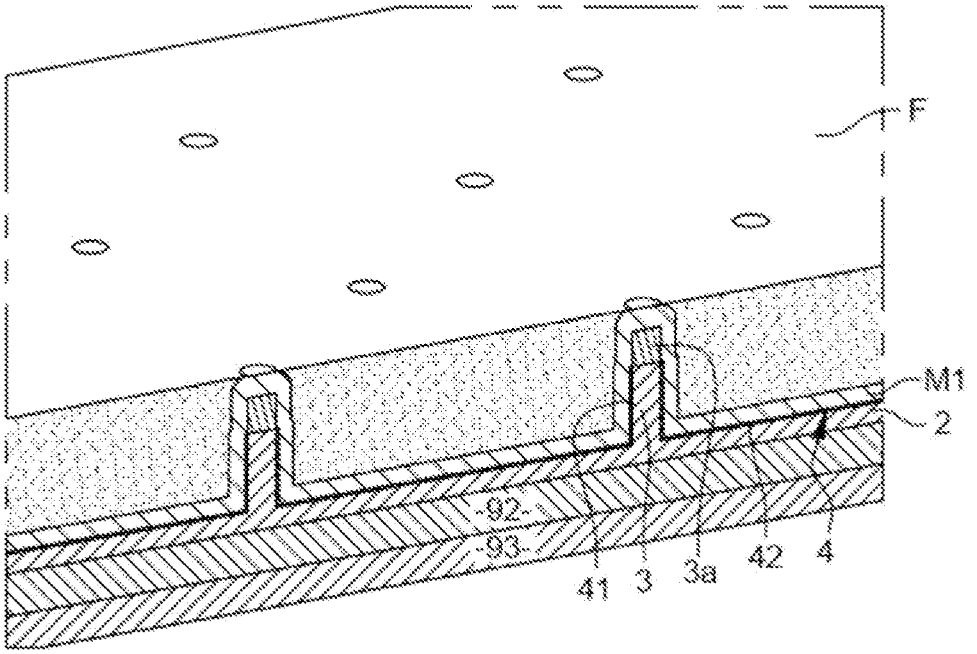
[Fig. 9]
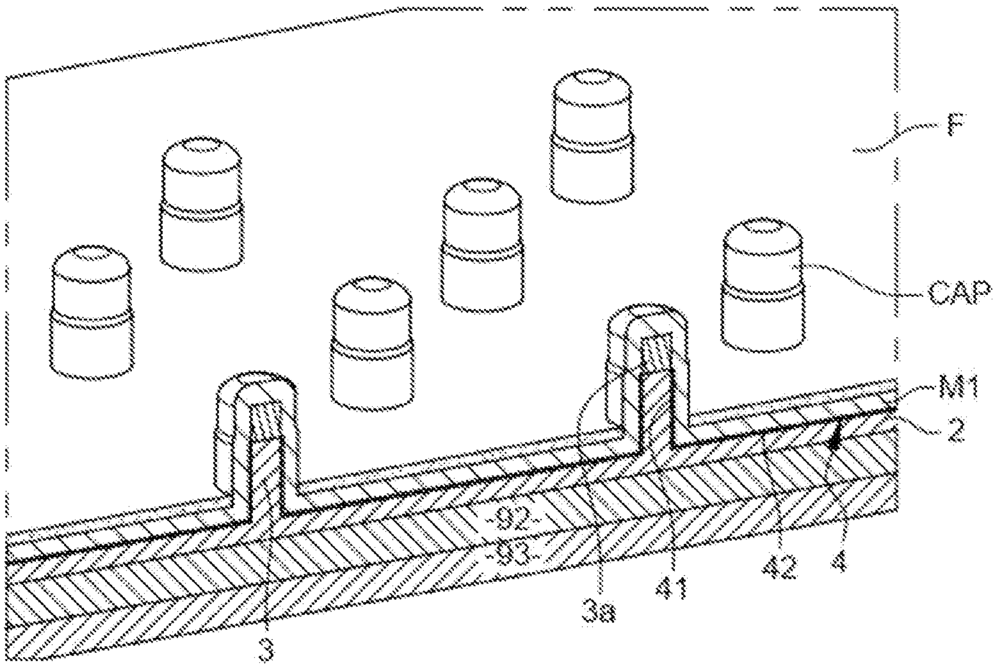

[Fig. 10]
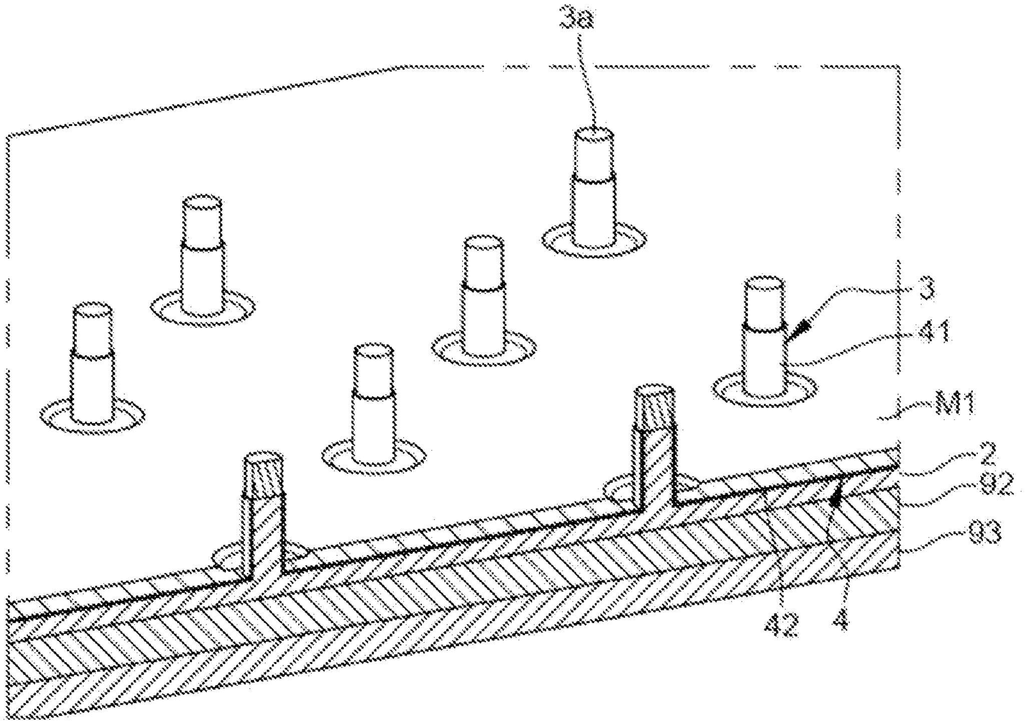
[Fig. 11]
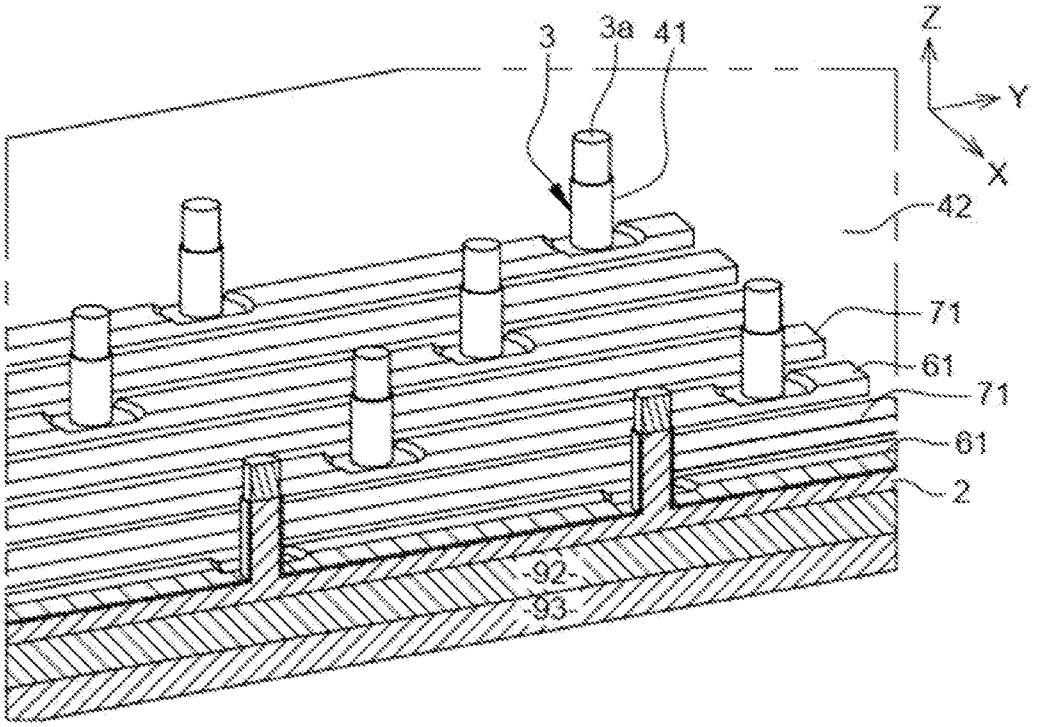

[Fig. 12]
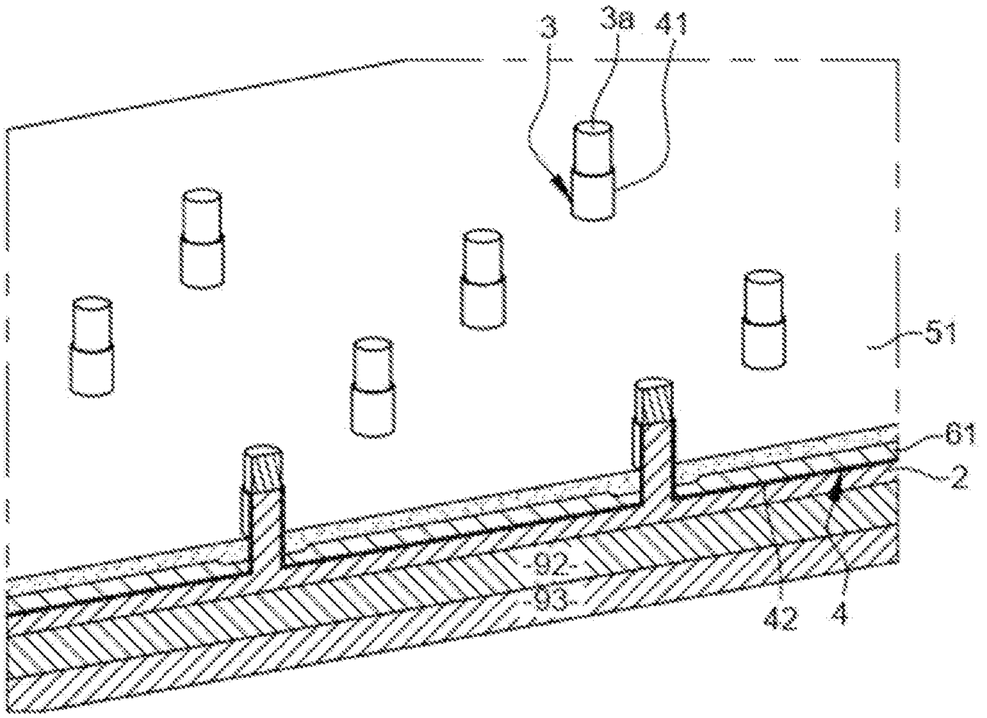
[Fig. 13]
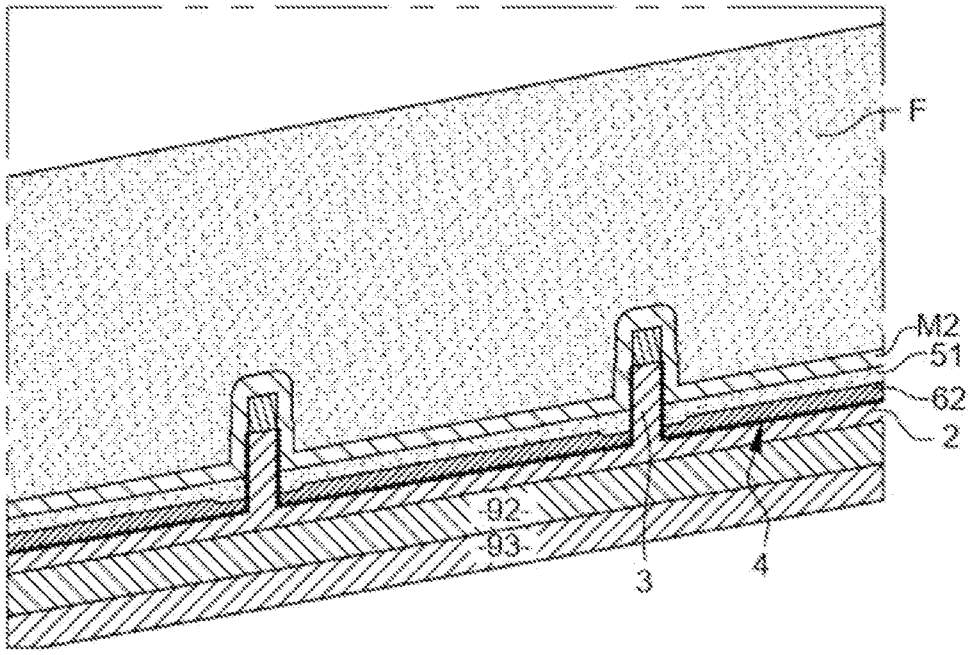

[Fig. 14]
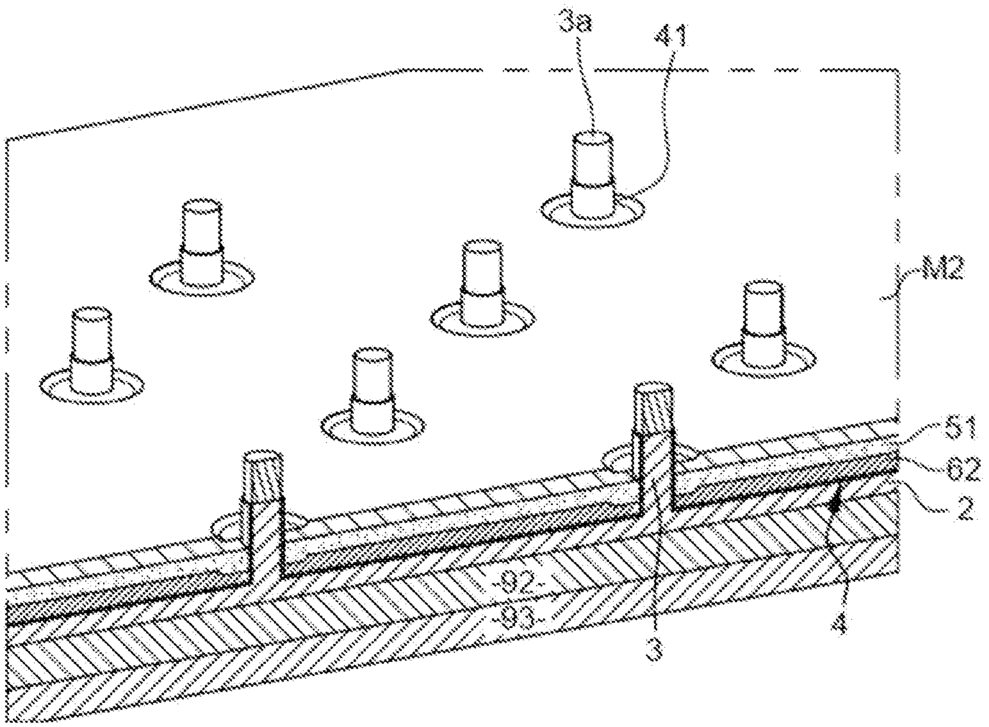
[Fig. 15]
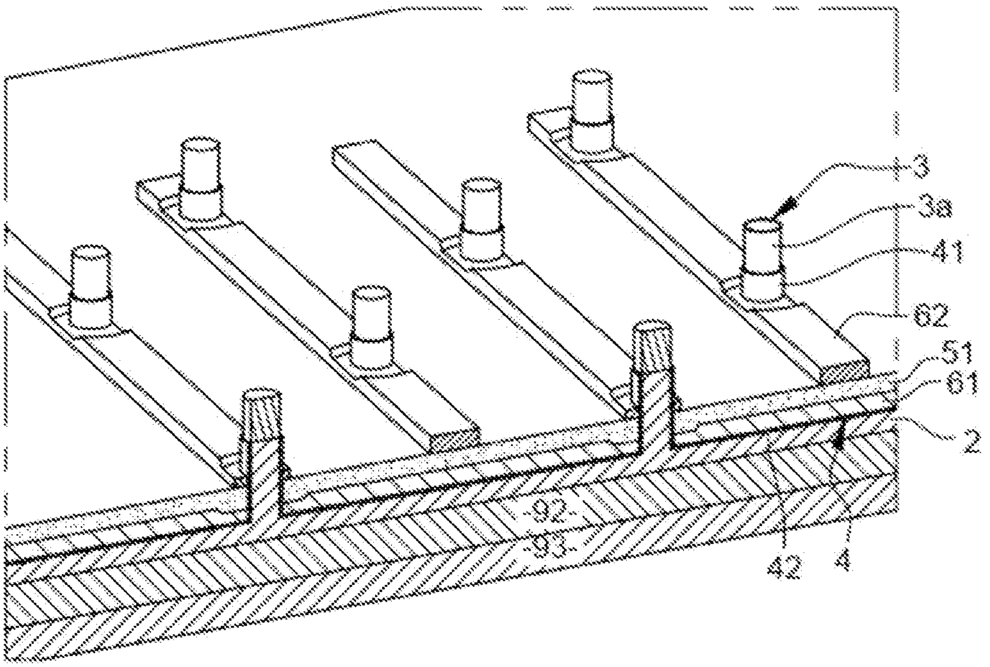

[Fig. 16]
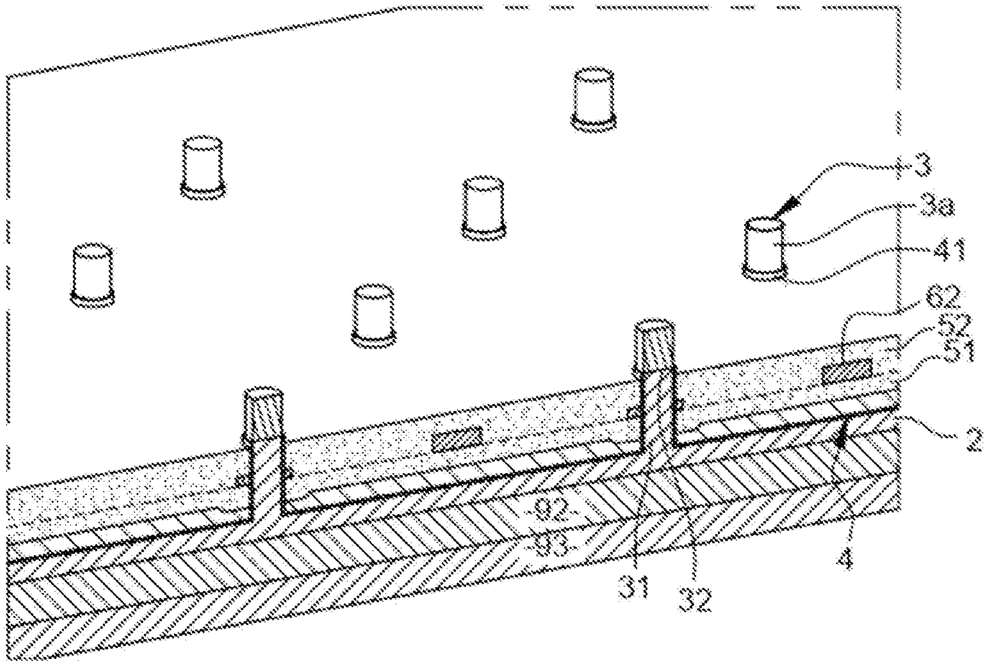
[Fig. 17]
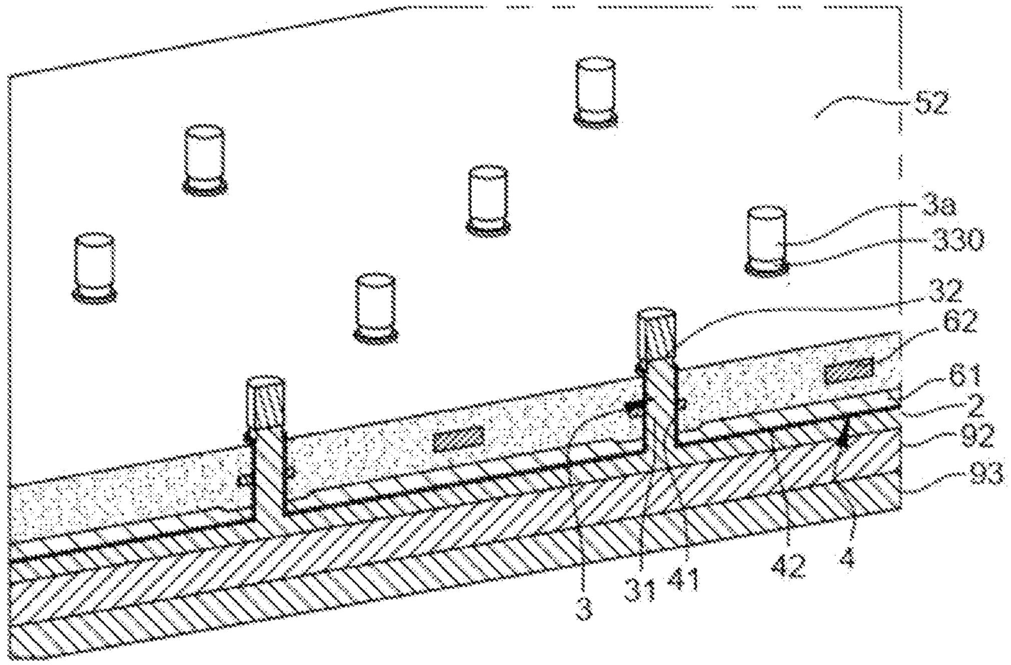

[Fig. 18]
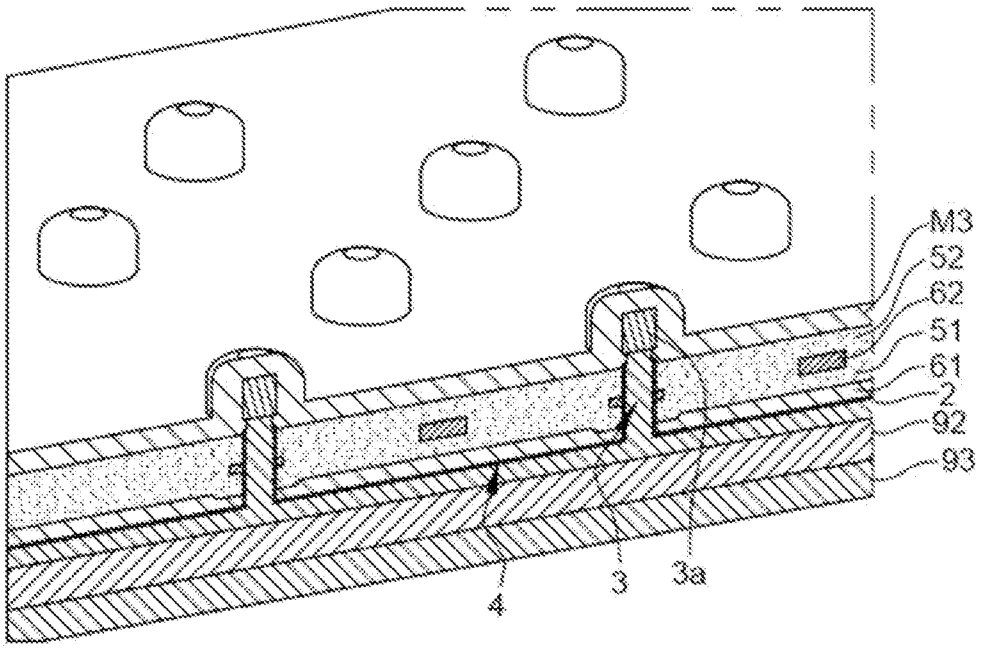
[Fig. 19]
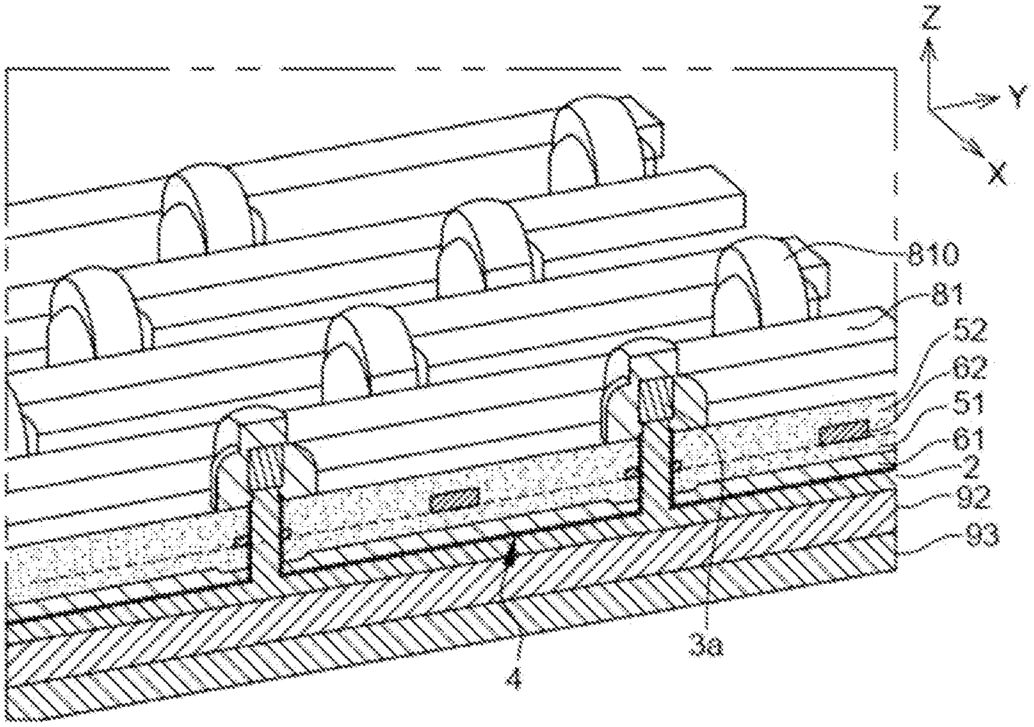

[Fig. 20]
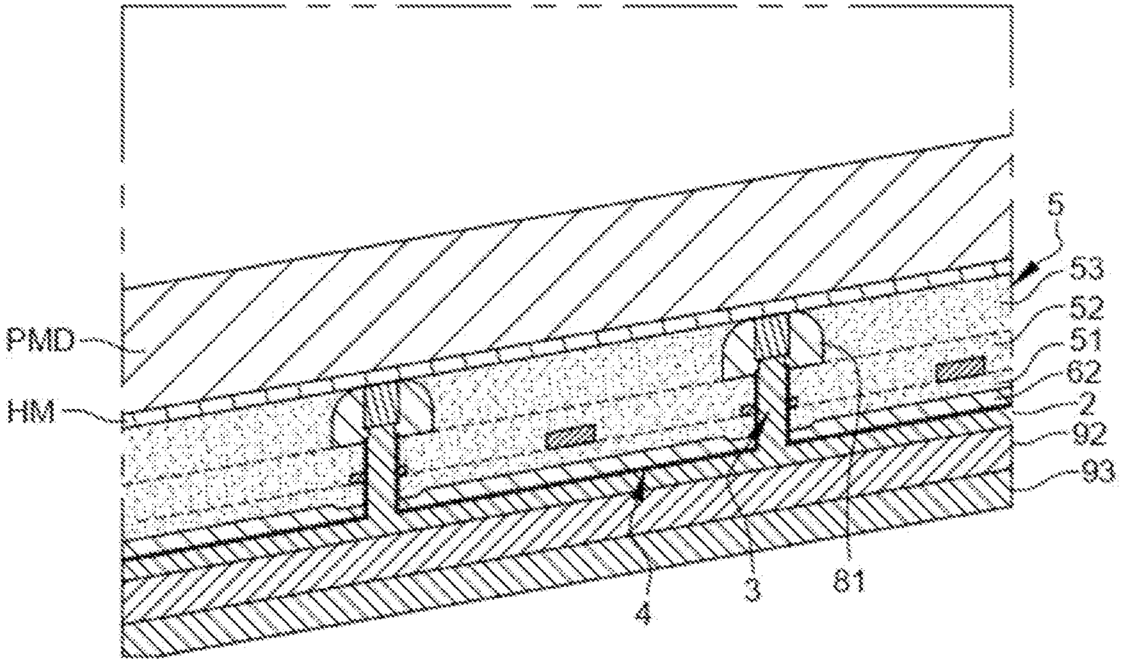
[Fig. 21]
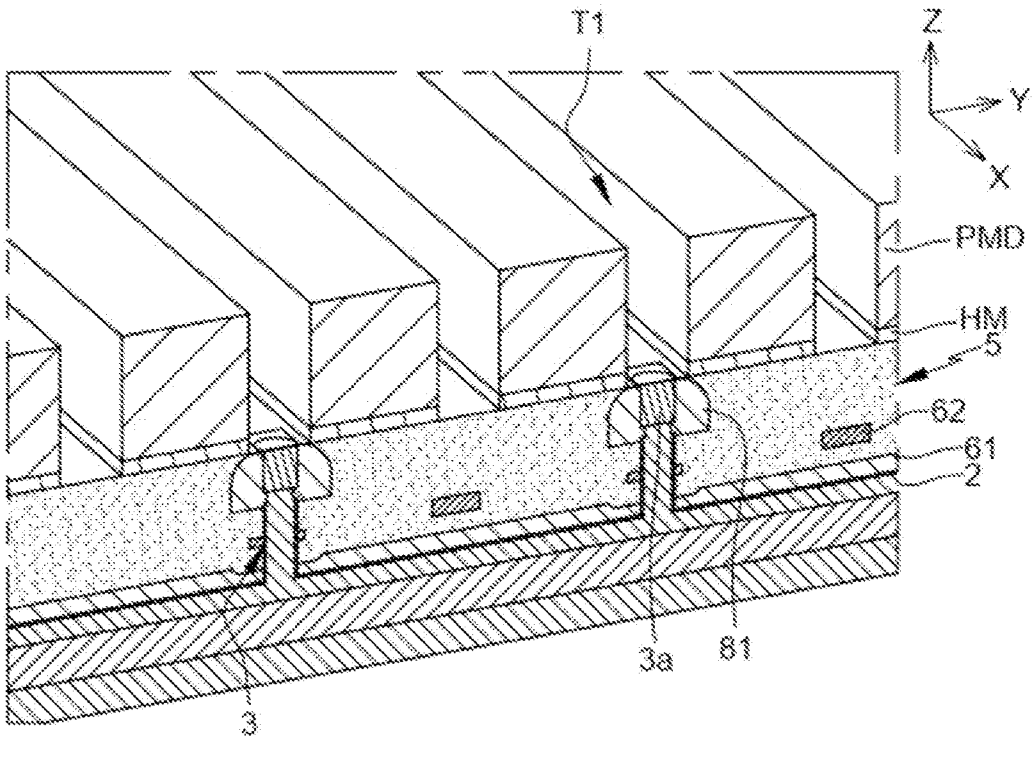

[Fig. 22]
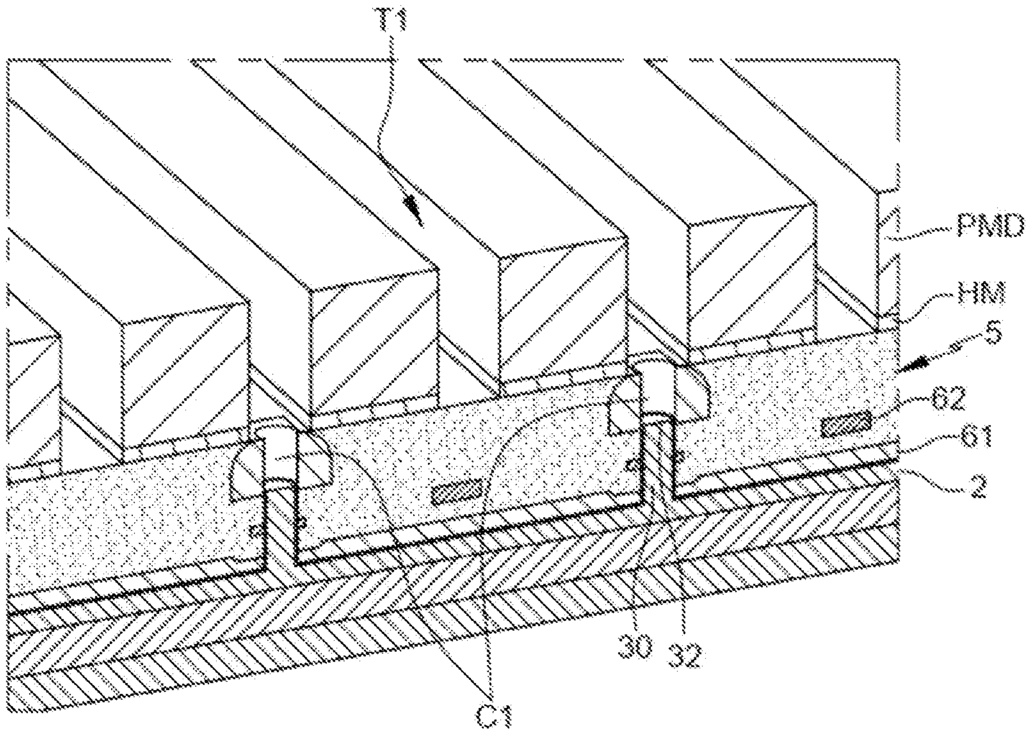
[Fig. 23]
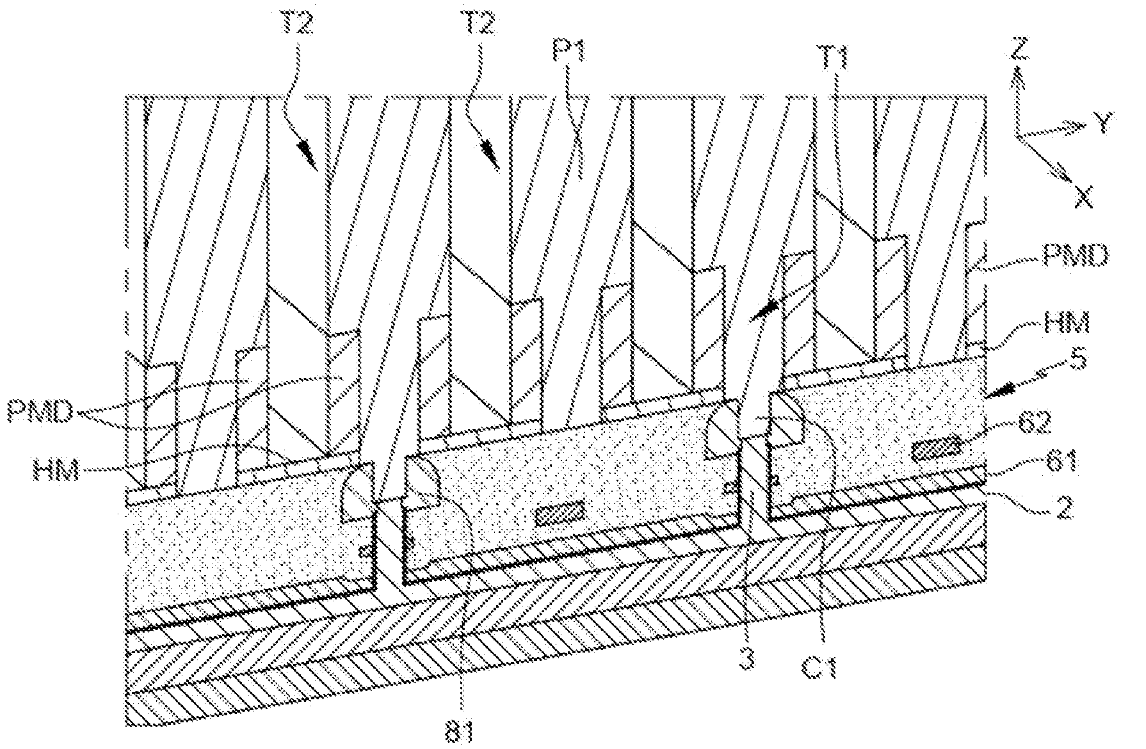

[Fig. 24]
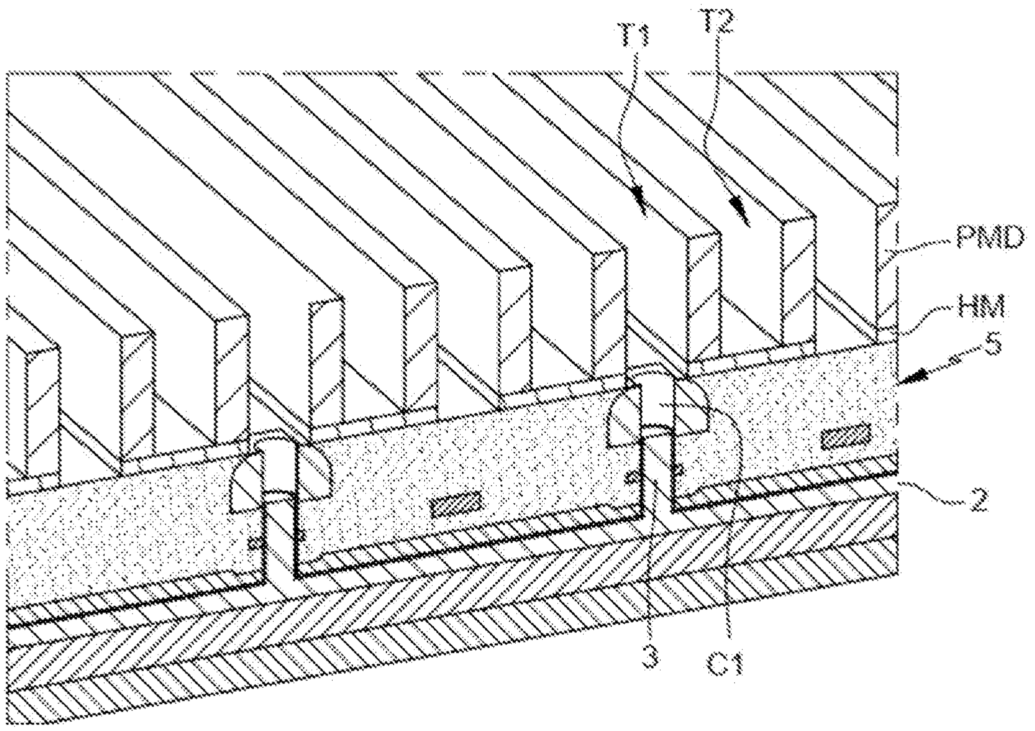
[Fig. 25]
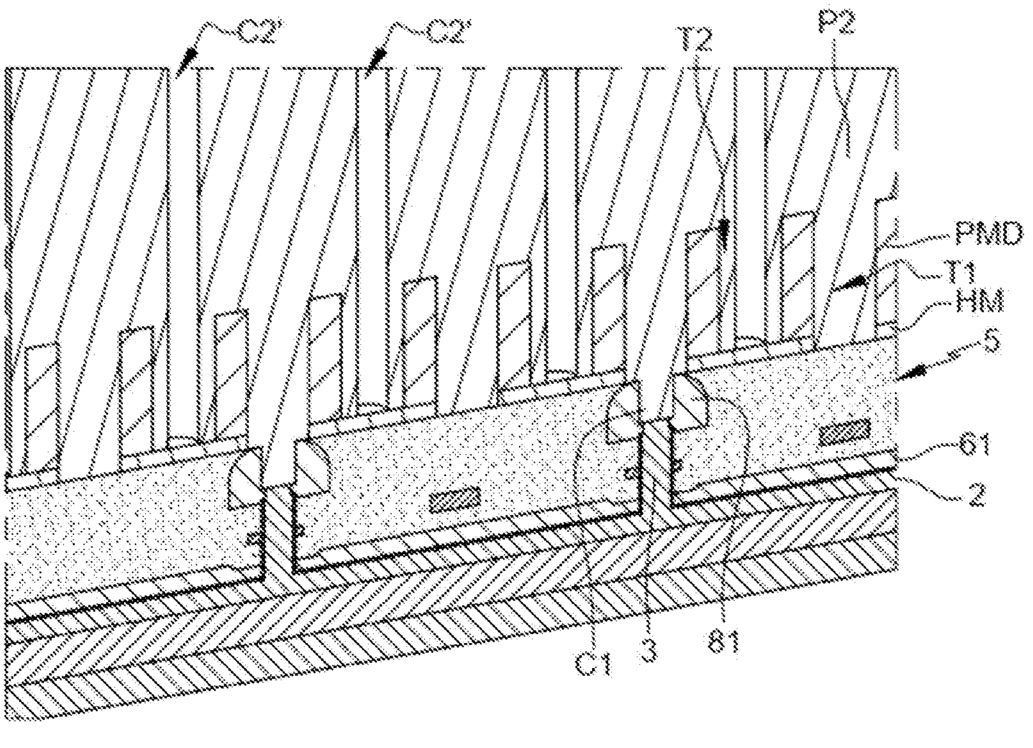

[Fig. 26]
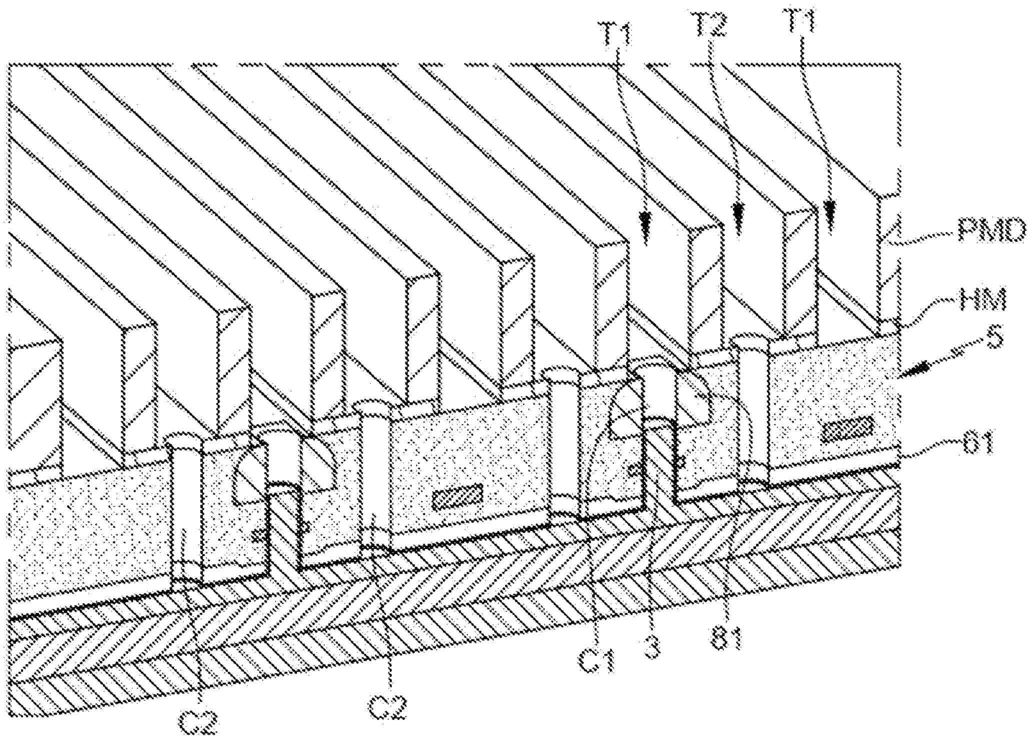
[Fig. 27]
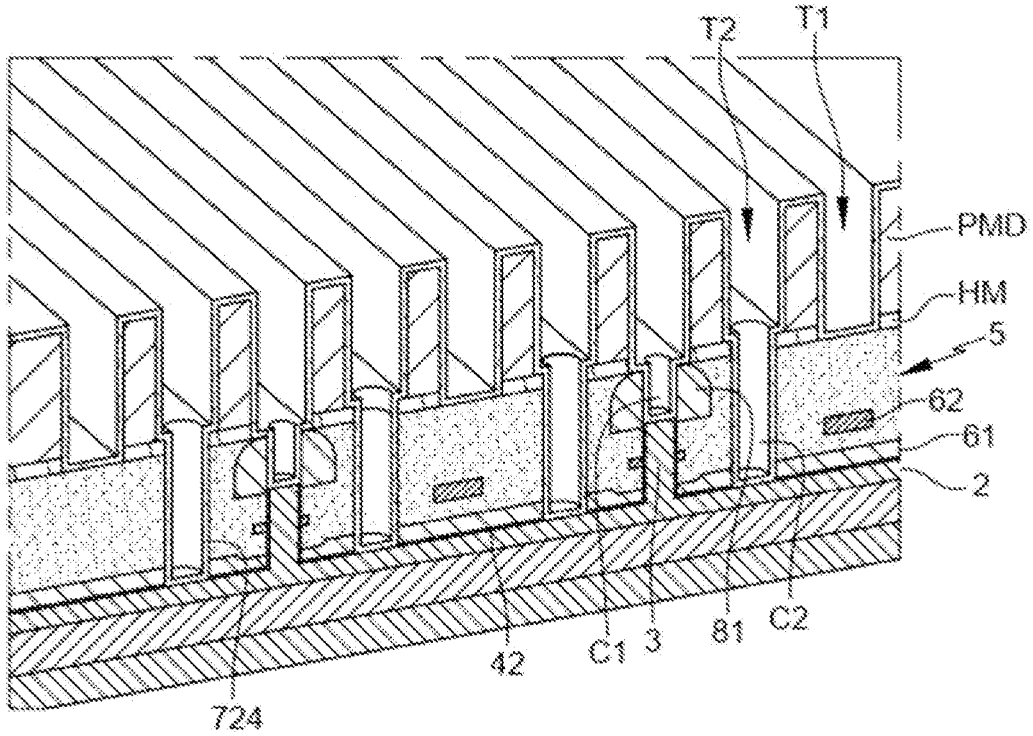

[Fig. 28]
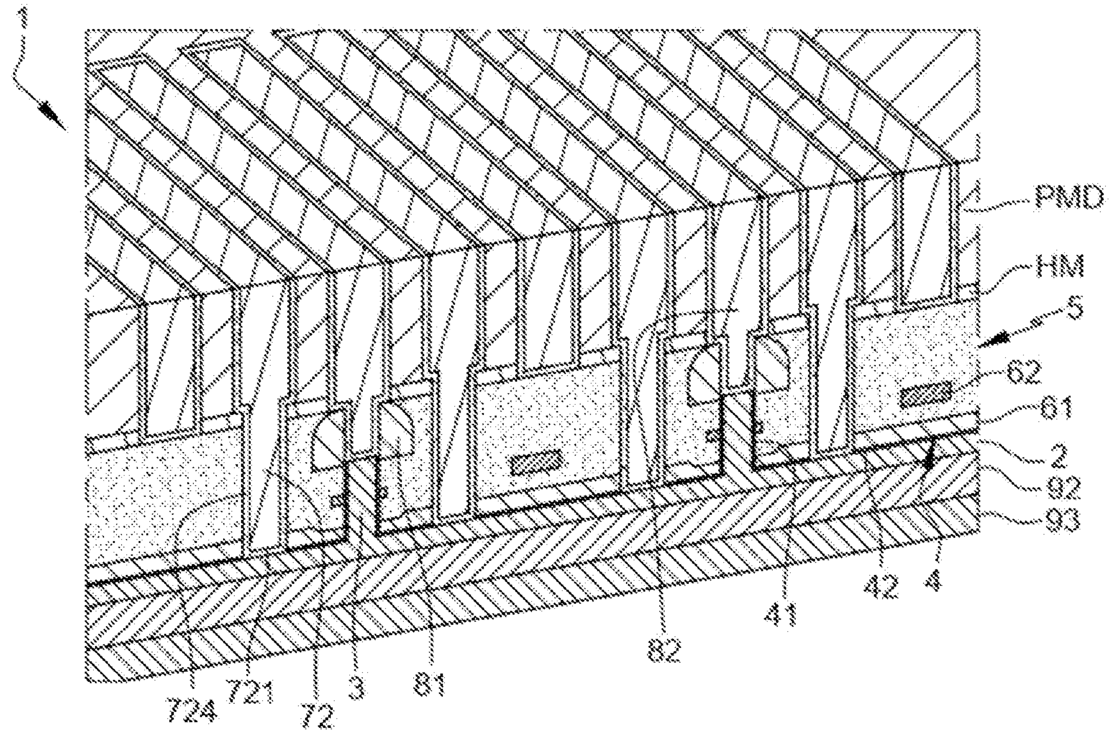

[Fig. 29]
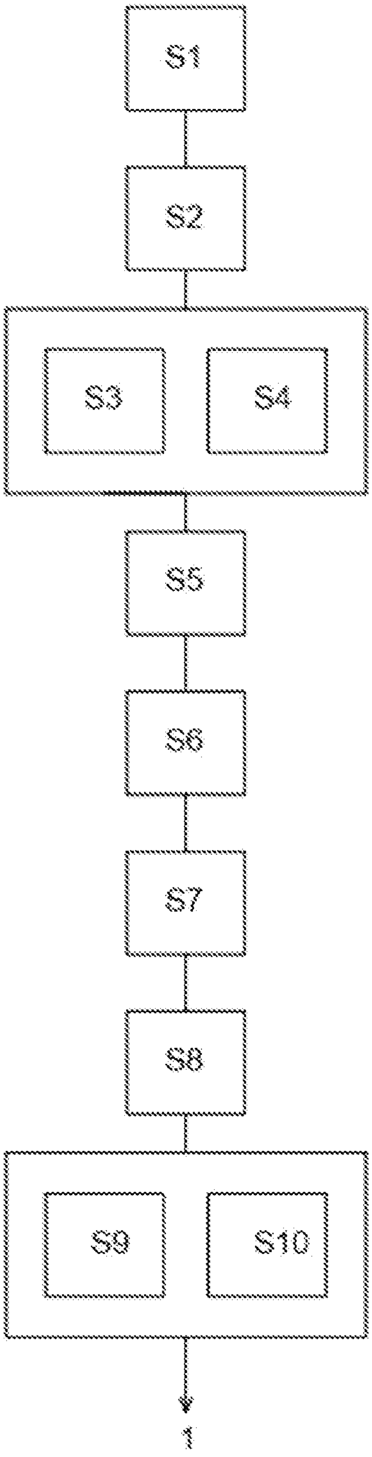

QUANTUM ELECTRONIC CIRCUIT AND METHOD FOR MANUFACTURING THE SAME

CROSS-REFERENCE TO RELATED APPLICATIONS

This application claims priority to French Patent Application No. 2302705, filed Mar. 22, 2023, the entire content of which is incorporated herein by reference in its entirety.

TECHNICAL FIELD OF THE INVENTION

The technical field of the invention is that of quantum electronics, and more particularly the manufacture of a quantum electronic circuit.

TECHNOLOGICAL BACKGROUND OF THE INVENTION

The manipulation of quantum states, also referred to as "qubits" for "quantum bits", offers new possibilities in the manipulation of information. Quantum electronic circuits capable of manipulating qubits comprise islands, also referred to as quantum dots. Quantum dots are capable of storing qubits while they are being manipulated and measured.

The integration of quantum dots in the form of quantum electronic circuits should satisfy several requirements. Firstly, a high density of quantum dots should be offered in order to provide significant computational capacity. Secondly, the methods for manufacturing said quantum electronic circuits should enable an industrial production rate to be achieved while ensuring low circuit variability. Indeed, the storage and manipulation of qubits within quantum dots are highly dependent on couplings between the different components forming the quantum electronic circuits.

Quantum electronic circuits should offer the possibility of coupling several qubits together to enable a calculation to be performed using a set of qubits. In some cases, the coupling operation is carried out by controlling a tunnel coupling between quantum dots containing the qubits. However, the control of tunnel couplings requires an architecture of interconnected quantum dots in the form of dense matrices. In addition, the quantum dots should also be able to be coupled to charge carrier reservoirs and charge detectors. To enable densification of the quantum dots, it is suggested integrating and connecting the charge carrier reservoirs and charge detectors in planes different from the plane comprising the quantum dots. In this case these are referred to as circuits with a non-planar, also referred to as "3D" for "3-dimensional" architecture.

Two types of 3D architecture circuits are emerging today. Firstly, circuits with individual control of the qubits, also referred to as "fully controlled" circuits, and secondly circuits with parallel control of the qubits, also referred to as "crossbar network" circuits. While individual control circuits make it easier to manipulate qubits, nevertheless they have a complex electrical architecture, with a high density of vias and interconnections. Parallel control circuits, on the other hand, offer a simpler architecture, especially by virtue of the reduction in the density of vias and interconnections.

Patent application FR 3 066 297 provides a parallel control quantum electronic circuit comprising a semiconductor layer and an array of electrodes disposed on either side of this semiconductor layer. The first electrode array controls coupling of the quantum dots with the charge reservoirs and charge detectors. The second electrode array controls coupling between the quantum dots. Proper operation of the circuit disclosed, however, relies on a proper alignment of both arrays on either side of the semiconductor layer.

The manufacture of such a circuit requires forming the first electrode array and flipping the semiconductor layer to form the second array or transferring, onto the first semiconductor layer, another semiconductor layer on which this 2nd array has been manufactured. These formation steps especially comprise bonding and flipping the substrate and releasing the rear face of the quantum dots to form the second electrode array. The bonding/flipping steps can be difficult to perform and can bring about defects at the bonding interface, such as electrostatic disorder. In addition, variations in the alignments of the pillars with respect to the quantum dots can alter coupling between the pillars and the quantum dots.

There is therefore a need to provide an electronic circuit that does not suffer from interface defects or alignment problems.

SUMMARY OF THE INVENTION

The invention offers a solution to the problem discussed, by making it possible to make a quantum electronic circuit with the two electrode arrays on a same side of the semiconductor layer. The manufacture of this device no longer requires the substrate to be flipped or bonded to form both arrays, nor does it present alignment problems.

For this, the invention relates to an electronic circuit comprising:

- a semiconductor layer, referred to as "qubit layer", having a first face;
- semiconductor pillars, distant from each other, extending perpendicularly to the front face of the qubit layer from the qubit layer, each semiconductor pillar comprising a first end, referred to as "base", in contact with the front face of the qubit layer;
- dielectric layers referred to as "flank dielectric", each flank dielectric surrounding the flank of one of the semiconductor pillars;
- a dielectric layer referred to as "spacer" extending in contact with the front face of the qubit layer and surrounding the base of each semiconductor pillar;
- first conductive electrodes, referred to as "coupling rows", parallel to each other and extending in parallel to the front face of the qubit layer, each coupling row being in contact with the flank dielectric of at least one of the semiconductor pillars;
- second conductive electrodes referred to as "coupling columns", parallel to each other and perpendicular to the coupling rows, extending in parallel to the front face of the qubit layer and distant from the coupling rows, each coupling column being in contact with the flank dielectric of at least one of the semiconductor pillars;

the circuit being characterised in that it also comprises:

- third conductive electrodes, referred to as "control rows", parallel to each other and parallel to the coupling rows and extending over the spacer, preferably in contact with the spacer, each control row being distant from the coupling rows, the coupling columns and the flank dielectrics of the semiconductor pillars; and
- conductive vias, referred to as "control vias", distant from the coupling columns, the control rows and the flank dielectrics of the semiconductor pillars, each of the control vias extending perpendicularly to the front face of the qubit layer, each via having a first end disposed in proximity to the front face of the qubit layer, without electrical contact with the qubit layer.

The terms “in parallel to” and “perpendicularly” may be read taking account of an uncertainty imposed by the manufacturing techniques in use. For example, by “in parallel to the front face of the qubit layer”, it is meant parallel to said face to within +/−20°. Similarly, by “perpendicularly to the front face of the qubit layer”, it is meant perpendicular to within +/−20°. By “in parallel to the coupling rows”, it is meant parallel to within +/−20°. By “perpendicular to the coupling rows”, it is meant perpendicular to within +/−20°.

Where it is indicated that rows and columns extend perpendicularly to each other, they extend perpendicularly by projection. They do not intersect each other and are not in direct contact.

By “disposed in proximity to a face”, it is meant disposed, without direct contact or electrical contact, less than 20 nm from this face and preferably less than 10 nm from this face and very advantageously, less than 5 nm from this face.

The qubit layer is a layer for receiving qubits. The control rows and vias make it possible to form a first matrix, referred to as “control matrix”, for modulating electrostatic potential at the qubit layer and thus to form quantum dots for receiving qubits. The coupling rows and columns make it possible to form a second matrix, referred to as “coupling matrix”, entangled in the control matrix, for modulating electrostatic potential at the semiconductor pillars.

As the control and coupling matrices are disposed on the same side of the qubit layer, on the front face, it is not necessary to flip the qubit layer in order to form them, or to perform bonding on the qubit layer. This also avoids alignment problems between the matrices.

Beneficially, the first end of each via is disposed in proximity to the front face of the qubit layer in order to modulate electrostatic potential in the qubit layer.

Beneficially, the first end of each via is disposed less than 15 nm from the front face of the qubit layer and preferably less than 10 nm from the front face of the qubit layer.

Beneficially, the thickness of the spacer is less than 15 nm and preferably less than 10 nm. In other words, the distance separating each control row from the qubit layer is less than 15 nm or even less than 10 nm.

Beneficially, the thickness of the qubit layer is between 5 nm and 35 nm.

Beneficially, each control row is disposed between two consecutive coupling rows, preferably equidistant from these two consecutive coupling rows, and each control via is disposed between two consecutive coupling columns, preferably equidistant from these two consecutive coupling columns.

Beneficially, each of the control vias passes through one of the coupling rows, without electrical contact.

Beneficially, each coupling row extends over the spacer.

Beneficially, the coupling rows and the control rows extend in a first plane, parallel to the first face of the qubit layer, wherein the coupling columns extend in a second plane also parallel to the first face of the qubit layer, the first plane being disposed between the first face of the qubit layer and the second plane.

Beneficially, each via has a second end, opposite to the first end, the second ends of a plurality of vias being electrically connected to each other.

Beneficially, the pillars are staggeredly disposed.

Beneficially, the first semiconductor layer is made of silicon, preferably enriched with an isotope, for example silicon 28.

Beneficially, the qubit layer and each semiconductor pillar are formed in a same single crystal semiconductor layer.

Beneficially, the spacer and the flank dielectrics are one and the same dielectric layer continuously extending over the front face of the qubit layer and the flanks of the semiconductor pillars. Preferably, said dielectric layer continuously extending is a thermal oxide.

Beneficially, each semiconductor pillar comprises a second end, referred to as “head”, opposite to the base, the head of the semiconductor pillar comprises a contact surface not being surrounded by each flank dielectric. By contact surface, it is meant that this surface allows direct contact with the semiconductor material of the semiconductor pillar. In other words, each flank dielectric surrounds the flank of one of the semiconductor pillars while leaving the contact surface of the flank of said semiconductor pillar free, at its head.

Beneficially, the circuit also comprises fourth electrodes referred to as “read rows”, each read row being in contact with the contact surface of the head of at least one of the semiconductor pillars.

Beneficially, the circuit also comprises gate structures referred to as “charging gates”, each charging gate being in contact with the head of at least one of the semiconductor pillars.

Another aspect of the invention relates to a method for manufacturing an electronic circuit, the method being implemented from a substrate comprising on one of its surfaces a first single crystal semiconductor layer and including the following steps of:

- forming semiconductor pillars distant from each other, each semiconductor pillar having a first end, referred to as “base”; and a semiconductor layer, referred to as “qubit layer”, at the base of each semiconductor pillar, the qubit layer having a first face, referred to as “front face”;
- oxidising the flank of each semiconductor pillar and the front face of the qubit layer so as to form a first dielectric layer comprising first portions, referred to as “flank dielectrics”, each flank dielectric surrounding the flank of one of the semiconductor pillars, and a second portion, referred to as “spacer”, extending in contact with the front face of the qubit layer and surrounding the base of each semiconductor pillar;
- forming first conductive electrodes referred to as “coupling rows”, parallel to each other and extending in parallel to the front face of the qubit layer, each coupling row being in contact with the flank dielectric of at least one of the semiconductor pillars;
- forming third conductive electrodes, referred to as “control rows”, parallel to each other and parallel to the coupling rows and extending over the spacer, each control row being distant from the coupling rows and the flank dielectrics of the semiconductor pillars;
- forming second conductive electrodes referred to as “coupling columns”, parallel to each other and perpendicular to the coupling rows, extending in parallel to the front face of the qubit layer and distant from the coupling rows and the control rows, each coupling column being in contact with the flank dielectric of at least one of the semiconductor pillars;
- forming conductive vias, referred to as “control vias”, distant from the coupling columns, the control rows and the flank dielectrics of the semiconductor pillars, each of the control vias extending perpendicularly to the front face of the qubit layer from the spacer and passing through one of the coupling rows, without electrical contact.

The method thus makes it possible to manufacture an electronic circuit comprising a qubit layer in which quantum dots for receiving the qubits can be formed. The method makes it possible to form semiconductor pillars having crystalline continuity with the qubit layer. Thus, variability of the circuits produced is reduced.

Beneficially, the coupling rows and the control rows are simultaneously formed.

The invention and its different applications will be better understood upon reading the following description and upon examining the accompanying figures.

BRIEF DESCRIPTION OF THE FIGURES

The figures are set forth by way of indicating and in no way limiting purposes of the invention.

In different views, FIG. 1, FIG. 2 and FIG. 3 show an electronic circuit according to the invention.

FIG. 4 schematically shows the equivalent system of the circuit of FIG. 1 to FIG. 3.

FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, FIG. 25, FIG. 26, FIG. 27, FIG. 28 set forth steps of a method for manufacturing the circuit of FIG. 1 to FIG. 3.

FIG. 29 schematically presents a flow chart of the steps of FIG. 5 to FIG. 28.

Unless otherwise specified, a same element appearing in different figures has a single reference.

The figures are set forth by way of indicating and in no way limiting purposes of the invention.

DETAILED DESCRIPTION

The invention provides an electronic circuit which can be used to form a quantum electronic circuit. This electronic circuit is in particular in that it comprises two electrode arrays, which may also be referred to as two electrode matrices, on a same side of a semiconductor layer for accommodating quantum bits, also referred to as "qubits". The interest of disposing the circuits on the same side is that the substrate does not have to be flipped in order to be manufactured.

The circuit also has reduced electronic behaviour variability. The reduction in variability is especially achieved by the crystalline continuity of the semiconductor layer for receiving the qubits and of the semiconductor pillars for initialising and measuring said qubits. Indeed, the circuit has no interface between these two elements.

FIGS. 1, 2 and 3 set forth one embodiment of the electronic circuit 1.

The circuit 1 is formed on a substrate 9 which, in FIGS. 1 to 3, extends in a {X;Y} plane. Substrate 9 comprises a bulk semiconductor layer 93, for example made of silicon, on which an insulating layer 92 (also referred to as BOX) rests. The bulk semiconductor layer 93 provides mechanical support for the circuit 1. The insulating layer 92 insulates the circuit 1 from the bulk layer 93.

Circuit 1 comprises a semiconductor layer 2, referred to as "qubit layer", resting on insulating layer 92. The qubit layer 2 has two faces **2*a*, 2*b* opposite to each other: a front face 2*a* and a rear face 2*b*. By convention, the rear face 2*b* is the face which is in contact with the insulating layer 92**.

The front face **2*a*** is preferably planar. In one embodiment, it is parallel to the {X;Y} plane.

The qubit layer 2 is for receiving the qubits. For this, it preferably exhibits characteristics enabling quantum dots to be formed therewithin. It has a thickness, measured perpendicularly to the {X;Y} plane, of between 5 nm and 35 nm and preferably between 10 nm and 20 nm, for example equal to 15 nm. It can also be crystalline, so as to disturb qubits as little as possible and also be compatible with standard manufacturing methods in the field. It can also be formed from silicon enriched with an isotope such as silicon 28 and is preferably comprised of silicon enriched with an isotope such as silicon 28. This increases the intrinsic coherence time of the qubits in the qubit layer 2. The concentration of silicon 28 in the qubit layer 2 is, for example, greater than 99.9%.

The circuit 1 also comprises semiconductor pillars 3. The pillars 3 extend along a direction perpendicular to the qubit layer 2 and more particularly to the front face **2*a* of the qubit layer 2. They rest on the qubit layer 2, in direct contact with the latter. In the embodiment of FIGS. 1 to 3, the pillars 3 are cylindrical in shape and extend along the Z-direction, perpendicular to the {X;Y} plane. The pillars 3 can be formed from the same semiconductor material as the qubit layer 2, preferably so as to create crystalline continuity between the pillars 3 and the qubit layer 2. The role of the pillars 3 is to form bridges between charge detectors and qubits which would be located under said pillars, in the qubit layer 2**, vertically to said pillars.

In this embodiment, the pillars 3 have a cross-section, considered in parallel to the front face **2*a*, which is circular. They have a diameter preferably between 30 nm and 60 nm, for example equal to 50 nm. Alternatively, the pillars 3 may have an elliptical or rectangular cross-section (current manufacturing limits tend to form rounded rectangles rather than perfect rectangles, in which case the perfect rectangles are considered to be drawn on the cross-sections of the pillars 3**). The largest dimension of the cross-section (i.e. the major axis of the ellipse or the long side of the circumscribed rectangle) is preferably between 30 nm and 60 nm.

Each pillar 3 has two ends 31, 32 opposite to each other referred to as "base" and "head". Each pillar 3 rests on the qubit layer 2 via its base 31. Each pillar 3 also has a flank 33, i.e. a surface surrounding it and extending from the base 31 to the head 32. The pillars 3 represented in FIGS. 1 to 3 are perfect cylinders, but the methods for manufacturing the pillars can induce variations in the shape of the pillars 2 without this affecting technical effects associated with the pillars 3. They can have a substantially frustoconical or inverted frustoconical shape or a combination of these shapes, such as an hourglass or barrel shape. The flanks 33 of each pillar 3 are therefore perpendicular to the front face **2*a*** to within 20°.

The pillars 3 are distant from each other. In the embodiment of FIGS. 1 to 3, the pillars 3 are staggeredly disposed. The distance separating the nearest neighbouring pillars, measured in parallel to the front face **2*a***, is for example greater than 30 nm, or even 60 nm. In order to maintain an interesting integration density, it may be desirable for this distance to be less than or equal to 100 nm.

The circuit 1 also has a dielectric layer 4 continuously extending over the front face **2*a* of the qubit layer 2, surrounding the base of each pillar 3 and extending over the flanks 33 of the pillars 3. There is a first portion 41 of the dielectric layer 4, referred to as "spacer", extending over the front face 2*a* of the qubit layer and surrounding the base 31 of each pillar 3. There are also second portions 42 of the dielectric layer 4, referred to as "flank dielectrics", which surround the flank 33 of each pillar 3**.

The dielectric layer 4 is obtained, for example, by thermal oxidation of the front face 2*a* of the qubit layer 2 and of the flanks 33 of the pillars 3. Since the qubit layer 2 and the pillars 3 are preferably formed from the same material, the dielectric material forming the dielectric layer 4 is the same at the different portions 41, 42, for example silicon oxide when the qubit layer 2 and the pillars 3 are made of silicon.

Alternatively, the dielectric layer 4 can be formed by a deposited dioxide rather than by oxidation of the pillars 3 and the qubit layer 2. The dielectric layer 4 has a thickness of between 5 nm and 10 nm. The thickness is measured perpendicularly to the front face 2*a* at the spacer 41 and perpendicular to the flanks of the pillars at the flank dielectrics 42.

The flank dielectrics 42 do not cover the whole of the pillars 3. They leave free an annular portion 330 of the flank 33, at the head 32 referred to as "contact surface". For example, in the case of a pillar 3 having a perfect cylindrical shape, said contact surface 330 extends from the cross-section of this cylinder, representing the head, and surrounds the pillar 3.

The circuit 1 also comprises two sets 6, 7 of electrodes 61, 62, 71, 72 referred to as "coupling array" and a "control array" or a "coupling matrix" and a "control matrix".

The role of the control array 7 is to control electrostatic potential in the qubit layer 2. This makes it possible, for example, to create electrostatic confinements in the qubit layer 2 so as to form quantum dots capable of receiving a qubit. The control array 7 can also be used to modify electrostatic configuration in the qubit layer 2 to couple two neighbouring quantum dots. This mechanism underlies the quantum operations performed with the qubits.

The control array 7 is configured to enable the electrostatic potential in the qubit layer 2 to be modulated so that quantum dots are disposed at the base 31 of each pillar 3. Indeed, the head 32 of each pillar 3 can be linked with a charge detector or a charge reservoir (described below) in order to measure the state of a qubit in the quantum dot or to initialise this quantum dot, respectively. The coupling array 6 makes it possible to control electrostatic potential within the pillars 3. It thus makes it possible to control coupling between a qubit in a quantum dot (vertical to a pillar 3) and a charge detector or a charge reservoir.

The feature of the invention lies in the disposition of these two arrays 6, 7 which are disposed on the same side of the qubit layer 2, especially facing the front face 2*a*.

The coupling rows and columns 61, 62 are designed to apply an electrostatic field to two distinct portions of each pillar 3, for forming two valves allowing or blocking passage of electrons in pillar 3 towards the quantum dot disposed in vertical alignment with or from it. For this, the rows and columns 61, 62 advantageously form, with the flank dielectrics 41, two separate gates at each pillar 3. In order to improve coupling of the coupling row and column 61, 62 with the pillar 3, it is preferable for the coupling row 61 to surround a first annular portion of the flank dielectric 41 of the pillar 3 and for the coupling column 62 to surround a second annular portion of the flank dielectric 41 of the pillar 3. The first and second annular portions are preferably positioned one above the other (i.e. along the Z-direction in FIG. 1).

Modulation of the electric field at two distinct annular portions makes it possible to form two electrostatic valves. The two valves should be simultaneously "open" for an electron to pass through pillar 3. In all other cases (only one of the two valves open or both closed), passage is blocked. This principle makes it possible to individually address a pillar 3 (and therefore the corresponding quantum dot) with a minimum number of coupling electrodes 61, 62.

The coupling rows 61 extend in parallel to the front face 2*a*. The coupling rows 61 are arranged in parallel to each other. To avoid short circuits, the rows are distant from each other. In addition, they are arranged so that each row 61 is in contact with the flank dielectric 41 of at least one pillar 3. In the embodiment of FIG. 1, each row 61 extends over the spacer 42, which itself extends over the front face 2. They are also parallel to each other. In the embodiment of FIG. 1, the pillars 3 are staggeredly arranged along the X- and Y-directions. Each row 61 also extends along the Y-direction and surrounds (by being in contact with) an annular portion of the flank dielectric 41 of several pillars 3, at the base 31 of each pillar 3.

The coupling columns 62 also extend in parallel to the front face 2*a*. They are also parallel to each other. The columns 62 also extend in a plane which is distant from the plane in which the coupling rows 61 extend. In the embodiment of FIG. 1, the columns 62 are embedded in an insulating material 5, such as a dielectric, separating the columns 62 from the rows 61. The coupling columns 62 cross the coupling rows 61 perpendicularly, to within 20°.

The columns 62 are also arranged so that each column 62 is in contact with the flank dielectric 41 of at least one pillar 3. In the embodiment of FIG. 1, each column 62 extends along the X-direction and surrounds (by being in contact with) an annular portion of the flank dielectric 41 of a plurality of pillars 3, at a distance from the base 31 of each pillar 3.

Thus, the coupling array 6 is formed by coupling rows and columns 61, 62 intersecting in a substantially perpendicular manner, i.e. perpendicular to within +/−20°.

In the embodiment of FIG. 1, the coupling rows 61 extend directly against the spacer 42. They could, in one alternative embodiment, be distant from the spacer 42, surrounding an annular portion of each pillar 3 which would be disposed between the base 31 of the pillars 3 and the head 32 of the pillars 3. In another alternative embodiment, the coupling rows 61 could be above the coupling columns 62 (considering the top to be the increasing Z-direction). The coupling columns 62 would thereby be disposed between (but preferably distant from) the spacer 42 and the plane in which the coupling rows 61 extend.

The coupling rows and columns 61, 62 are made of a conductive material, for example metal (TIN, W) or polycrystalline doped silicon.

The purpose of the control array 7 is to control electrostatic potential in the qubit layer 2, while the purpose of the coupling array 6 is to control the electrostatic potential in the pillars 2. This makes it possible to create quantum dots capable of receiving a qubit. The feature of circuit 1 is that the control array 7 is disposed on the same side as the coupling array 6. This makes it easier to manufacture and align the arrays with each other, especially reducing the variability that can be observed between two circuits 1. To this end, the control array 7 comprises third electrodes 71 referred to as "control rows" and conductive vias 72 referred to as "control vias".

The control rows 71 are conductive rows which, together with the spacer 42, form gates in the qubit layer 2. For this, they extend in parallel to the front face 2*a* of the qubit layer 2 and directly over the spacer 42. Thus the control rows 71 are spaced apart from the qubit layer 2 only by the thickness of the spacer 42. Together with the portions of the spacer 42 disposed between the control rows 71 and the qubit layer 2, the control rows 71 form gates at the qubit layer 2. Coupling of these gates can be determined by the thickness, measured perpendicularly to the front face 2*a*, of the spacer 42.

Advantageously, and as set forth in FIGS. 1 to 3, the control rows 71 extend in parallel to the coupling rows 61. They are especially distant from the coupling rows 61 and the coupling columns 62. The control rows 71 differ from the coupling rows in that they are distant from the pillars 3 and especially from the flank dielectrics 41 of the pillars 3. Thus they have no, or only a negligible, influence on the electrostatic potential in the pillars 3.

The control vias 72 are conductive electrodes which also form gates at the qubit layer 2. Unlike the control rows 71 (or the coupling column and rows 61, 62), the vias 72 extend perpendicularly to the front face 2*a* of the qubit layer 2. They thus fit effortlessly into the coupling and control arrays 6, 7 which are interleaved with each other. In the embodiment of FIGS. 1 to 3, the vias extend along the Z-direction.

Each via 72 has first and second ends 721, 722, referred to as "base" and "head", opposite to each other. Each via 72 then extends towards the qubit layer 2 so that the base 721 of said via 72 is in proximity to the front face 2*a*, without however making electrical contact with the same. By virtue of the proximity of the base 721 and the qubit layer 2, the via 72 can modulate electrostatic potential in the qubit layer 2.

In a first development, the bases 721 of the vias 72 are directly in contact with the spacer 42. For example, the base 721 is in contact with the spacer 42 and the head 722 is disposed vertically aligned with the first end 721. The spacer 42 electrically insulates the vias 72 from the qubit layer 2. The thickness of the spacer 42 thus imposes a distance between the base 721 of the vias 72 and the qubit layer 2.

In the embodiment of FIGS. 1 to 3, the vias 72 may be surrounded by an insulating layer 724 which embeds the flank 723 of the vias 72 and extends between the base 721 of the vias 72 and the qubit layer 2. The insulating layer 724 insulates the vias 72 from the qubit layer 2. It may be formed from a dielectric material such as $SiO_2$. This insulating layer 724 may have a thickness of approximately less than 10 nm, for example 3 nm.

In order to be able to form a rectangular arrangement of quantum dots in the qubit layer 2, each control row 71 is disposed between two consecutive coupling rows 61 and each control via 72 is disposed between two consecutive coupling columns 62.

Preferably, each via 72 may extend perpendicularly to the front face 2*a*, from the front face 2*a* (but without electrical contact therewith), passing through one of the coupling rows 61, without electrical contact. For example, in the embodiment of FIGS. 1 to 3, the coupling rows 62 extend along the Y-direction, joining pillars 3 which are arranged along this direction. The coupling rows 62 then surround the base 721 of the vias 72 which are also disposed between the pillars 3. In order to avoid any short-circuit, the insulating layer 724 surrounds the flank 723 of each via 72, at least at the flank portion 723 facing the coupling row 61.

The vias 72 are preferably distant from the coupling columns 62, the control rows 71 and the flank dielectrics 41 of the pillars 3.

The heads 722 of a plurality of vias 72 may be electrically connected to each other. The connected vias 72 are, for example, the vias 72 that are aligned along a direction parallel to the front face 2*a* and perpendicular to the coupling rows 61. In FIGS. 1 to 3, these are the vias 71 aligned along the X-direction.

The circuit 1 preferably comprises fourth electrodes 81 referred to as "read electrodes", which make it possible to determine the charge state of quantum dots which would be located vertically aligned with the pillars 3. Each read row 81 is in direct contact with the flank 33 of at least one pillar 3. The read rows 81 preferably extend in a plane parallel to the front face 2*a* of the qubit layer 2, said plane being close to the heads 32 of the pillars 3. By close, it is meant to within +/−20 nm, measured perpendicularly to the front face 2*a*. The read rows 81 preferably extend in parallel to the coupling rows 61. However, unlike the coupling rows, the read rows 81 can be electrically connected to each other. They also connect a plurality of pillars 3 (via their flank 33).

The flank dielectrics 41 can be formed so as to cover only part of the height of the pillars 3, leaving the head 32 of the pillars 3 and a part 330 of each flank 33 protruding in the vicinity of the head 32, referred to as "contact surface". Advantageously, the read rows 81 are directly connected to these contact surfaces 330 of the flanks 33 of the pillars 3.

The circuit 1 preferably comprises gate structures 82, referred to as "charging gates", which enable the qubits in the quantum dots vertically aligned with the pillars to be initialised. These charging gates 82 are directly connected to the head 32 of at least one pillar 3 or even several pillars 3. A charging gate comprises a conductor, for example made of metal, and an insulating layer formed, for example, from an oxide. The conductor is disposed facing the head 32 of a pillar 3 (or of a plurality of pillars 3) and insulated therefrom by means of the insulating layer.

In the embodiment of FIGS. 1 to 3, the read rows 81 are disposed so as to surround the contact surface 330 of the flank 33 of the pillars 3 while leaving the head 32 as such of the pillars 3 free. The read rows additionally form wells around the head 32 of the pillars 3, the bottom of the wells corresponding to the head 32 of the pillars 3. The charging gates 82 fill these wells. The aforementioned insulating layer lines the edges and bottom of the wells and the conductor fills the space left free.

In the embodiment of these figures, each charging gate 82 extend along the X-direction and connects the head of the pillars 3 which are aligned along this direction.

The circuit 1 preferably comprises an insulating layer 5 which extends over the spacer 42. The insulating layer 5 extends over the spacer 41 and surrounds the parts of the pillars 3 left free by the coupling rows and columns 61, 62 as well as by the read rows 81 and charging gates 82. It also coats the coupling rows and columns 61, 62 as well as the control rows and vias 71, 72. Of course, when the coupling rows 61 and control rows 71 extend against the spacer 42, the insulating layer 5 covers the same, without interposing itself between these rows 61, 71 and the spacer 42. The insulating layer 5 can be made of a dielectric material such as $SiO_2$.

FIG. 4 shows an equivalent diagram of the circuit 1 set forth in FIGS. 1 to 3. The qubit layer 2 is not materialised but an arrangement of the quantum dots that can be formed in the qubit layer 2 is represented by circles with an arrow (to materialise a qubit).

The pillars 3 are staggeredly arranged. The coupling rows 61 and coupling columns 62 are arranged crossing each other at a constant pitch and connect the pillars which are aligned along the Y and X-directions respectively. The control rows extend in parallel to the coupling rows 62, equidistant from the neighbouring coupling rows 61. The vias 72, the base of which is represented, are disposed according to a square array. Each via 72 (the base 721 of each via 72) is disposed equidistant from the control rows 71 and the coupling columns 62. Each via 72 is materialised on the coupling rows 61. This is to be understood as meaning that the vias 72 pass through the coupling rows 62 without making electrical contact. This arrangement of the coupling and control arrays 6, 7 makes it possible to form quantum dots according to a square grid. Half of the quantum dots are disposed under a pillar 3 and the other half are distant from these pillars 3.

FIGS. 1 to 3 show cross-sections A-A, B-B and C-C, the planes of which are shown in FIG. 4.

FIGS. 5 to 28 schematically show one implementation mode of a manufacturing method according to the invention, for obtaining an electronic circuit 1 according to FIGS. 1 to 3. The steps are materialised in the diagram of FIG. 29. The method comprises the following steps of:

forming S1 the pillars 3; and the qubit layer 2, said qubit layer 2 having a rear face 2*b* and a front face 2*a*, the pillars being in contact with the front face 2*a* of the qubit layer 2;

oxidising S2 the flank of each pillar 3 and of the exposed face (which corresponds to the front face 2*a*) of the qubit layer 2 so as to form a dielectric layer 4. The dielectric layer 4 comprises:

a first portion 41 which corresponds to the spacer 42, extending over the front face 2*a* of the qubit layer 2 and surrounding the base 31 of each pillar 3; and second portions 42 corresponding to the flank dielectrics surrounding the flank 33 of each pillar 3;

forming S3 the coupling rows 61, parallel to each other and extending in parallel to the front face 2*a* of the qubit layer 2, each coupling row 61 being in contact with the flank dielectric 41 of at least one of the pillars 3; and forming S4 the control rows 71, parallel to each other and parallel to the coupling rows 61 and extending over the spacer 42, each control row 71 being distant from the coupling rows 61 and from the flank dielectrics 41 of the semiconductor pillars 3;

forming S6 the coupling columns 62, parallel to each other and perpendicular to the coupling rows 61, extending in parallel to the front face 2*a* of the qubit layer 2 and distant from the coupling rows 61 and the control rows 71, each coupling column 62 being in contact with the flank dielectric 41 of at least one of the semiconductor pillars 3;

forming S10 the control vias 72, distant from the coupling columns 62, the control rows 71 and the flank dielectrics 41 of the semiconductor pillars 3, each of the control vias 72 extending perpendicularly to the front face 2*a* of the qubit layer 2, each via 72 having a first end 721 disposed in proximity to the front face 2*a* of the qubit layer 2, without electrical contact with the qubit layer 2.

The method thus makes it possible to manufacture the circuit 1 comprising a qubit layer 2. The qubit layer 2 can receive the qubits while being stored and manipulated.

The method provided by document FR 3 066 297 of prior art comprises epitaxial regrowth at the quantum dots. However, epitaxial growth can cause crystalline readjustment and/or the appearance of defects at the interface between the starter layer and the epitaxially grown layer. The method according to the invention makes it possible to obtain the qubit layer 2 and the pillars 3 etched in the same first semiconductor layer 91, i.e. in the same crystal. Said etching makes it possible to delimit the plurality of pillars 3 and the qubit layer 2 while maintaining crystalline continuity between the layer 2 and the pillars 3, thus avoiding the appearance of defects or an interface. Crystalline continuity can be monitored by imaging techniques such as scanning electron microscopy or transmission electron microscopy. A circuit obtained by the method according to the invention would show an absence of interface between the qubit layer 2 and the pillars 3. A circuit obtained by a method of prior art would show defects or an interface between the qubit layer and the pillars.

The method according to the invention also makes it possible to simplify manufacture of circuits by reducing the number of transfers required to manufacture the coupling rows and columns and the qubit layer. It also eliminates the need to flip the qubit layer 2 to form the control array 7 and thus avoids misalignment between the coupling and control arrays 6, 7.

Forming S1 the pillars 3 and the qubit layer 2 can be achieved by means of etching made in a substrate 9 as illustrated in FIG. 5, including the first semiconductor layer 91 on one of these surfaces. The first semiconductor layer 91 is a single crystal layer and advantageously comprises a defect density of less than $10^6$ $cm^{-3}$. The thickness of the first semiconductor layer 91, measured perpendicularly to the free surface, is preferably greater than or equal to 100 nm. The thickness of the first semiconductor layer 91 makes it possible to etch said layer 91 so as to form the qubit layer 2 while ensuring that the pillars 3 are sufficiently high to protrude beyond the coupling rows and columns 61, 62. The thickness of the first semiconductor layer 91 can be reduced or increased depending on whether the circuit 1 to be manufactured includes more or fewer coupling rows/columns. For example, third conductive electrodes, for example forming coupling diagonals, could be added, requiring larger pillars 3.

As mentioned previously, the first semiconductor layer 91 is made of single crystal silicon in order to be compatible with standard manufacturing methods in the field. Silicon of the first semiconductor layer S1, if applicable, can also be enriched with an isotope such as silicon 28. This increases the intrinsic coherence time of qubits. The concentration of silicon 28 in the first semiconductor layer 91 is, for example, greater than 99.9%.

The first semiconductor layer 91 may be obtained from a substrate 9, for example of SOI type, comprising a front-face semiconductor layer 911, a rear-face semiconductor layer 93 and an insulating layer 92. The insulating layer is disposed between the two previous layers 911, 93, in other words buried under the front-face semiconductor layer 911. An epitaxy from the single crystal front-face semiconductor layer 911 makes it possible to obtain an epitaxially grown semiconductor layer 912. The front-face single crystal semiconductor layer 911 and the epitaxially grown semiconductor layer 912 thus form the first semiconductor layer 91. Epitaxy carried out preferably in full plate makes it possible to maintain crystalline quality of the front face semiconductor layer 911 and thus obtain a first single crystal semiconductor layer 91. In addition, epitaxy makes it possible to control thickness of the epitaxially grown semiconductor layer 912 and therefore thickness of the first semiconductor layer 91 without resorting to an etching step. The first semiconductor layer 91 then comprises the epitaxially grown semiconductor layer 912 and the front face semiconductor layer 911. It is preferable for the first semiconductor layer 91 to have good crystalline quality in order to manufacture a quantum electronic circuit with good electronic characteristics and low variability. For this reason, it is preferred that the first semiconductor layer is partly obtained by epitaxy.

The epitaxially grown semiconductor layer 912 can also be thinned if it is too thick. A method well known to those skilled in the art, such as successive oxidation/etching steps, can be implemented.

FIG. 6 illustrates forming S1 the first semiconductor layer S1 so as to obtain the pillars 3 and the qubit layer 2. For this, a first part of the first semiconductor layer 91 is etched in order to obtain the intermediate circuit illustrated in FIG. 6. In order to obtain the plurality of pillars 3, said etching is advantageously carried out anisotropically, i.e. along a preferential direction, preferably perpendicular to the free surface of the first semiconductor layer 91. Protective pads 3*a*, referred to as "hard masks", may be disposed on the surface of the first semiconductor layer 91 to protect part of said layer and to enable a pillar 3 to be formed under each of the protective pads 3*a*.

A particular arrangement of the qubits within the qubit layer in the circuit in operation makes it possible to implement an error correction method referred to as "surface code". For this, the qubits are preferably arranged in a square array with a given pitch. A first part of the qubits is to form data qubits and a second part of the qubits is to form measurement qubits. The data and measurement qubits are disposed alternately, thus forming an array of staggered data qubits and an array of staggered measurement qubits. The staggered qubit arrays thus have twice the pitch of the square array. Only the measurement qubits are intended to be disposed vertically aligned with the pillars 3, and it is thus advantageous to staggeredly dispose the same.

Etching the first part of the first semiconductor layer 91 is also carried out in such a way as to maintain a second part 2 of the first semiconductor layer 91, forming the qubit layer. By maintain, it is meant that etching is stopped, for example, before the entire thickness of the first semiconductor layer 91 has been etched. Said etching is carried out so that the thickness of the qubit layer 2, measured in parallel to the direction of etching, is preferably between 5 nm and 35 nm, preferably between 10 nm and 20 nm, for example equal to 15 nm. The qubit layer has a front face 2*a* and a rear face 2*b*. The rear face 2*b* is the face facing the buried layer 92. The front face 2*a* is preferably planar.

The pillars 3, as illustrated in FIG. 6, thus rest on the front face 2*a* of the qubit layer 2. The base 31 (i.e. one of the two ends) of each pillar 3 rests on the qubit layer 2. The head 32 of each pillar 3 is preferably disposed under a protective pad 3*a*. Etching the first semiconductor layer 91 thus makes it possible to obtain crystalline continuity between the pillars 3 and the qubit layer 2 at each base 31 of the pillars 3.

As the first semiconductor layer 91 is a single crystal layer, the qubit layer 2 and the pillars 3 are therefore made from the same crystal. Each pillar 3 may have a height, measured perpendicularly to the qubit layer 2, from the base of said pillar 3 to its head, greater than 50 nm and preferably greater than or equal to 80 nm.

Each pillar 3 may have one or more flanks 33 according to whether it is cylindrical or parallelepipedal. For the sake of simplicity in the remainder of the description, reference will be made only to "the flank" of a pillar 3 to designate the flank or flanks of said pillar 3, according to whether the latter is cylindrical or parallelepipedal. When etching implements protective pads 3*a*, the flank 33 of each pillar 3 is thus disposed vertically aligned with the perimeter of each protective pad 3*a*. The diameter of each pillar 3, measured along a plane parallel to the front face 2*a* of the qubit layer 2, may coincide with the diameter of each protective pad 3*a* and is for example between 30 nm and 60 nm, for example equal to 50 nm. The diameter of each pillar 3 may also be less than the diameter of each protective pad 3*a*, especially when the etching implemented is not totally anisotropic. Thus the flank of each pillar 3*a* is slightly recessed from the vertical alignment of the perimeter of each pad 3*a*.

The method advantageously includes, before etching the first semiconductor layer 91, forming the plurality of protective pads 3*a* on the first semiconductor layer 91. The protective pads 3*a* are preferably formed by depositing a hard mask layer, followed by photolithography of a resin mask and anisotropically etching the pads 3*a* through the resin mask. The protective pads 3*a* can also be formed by photolithography of a resin mask and depositing a so-called hard mask layer, for example of SiN. Preferably, the protective pads 3*a* have a contour that may be circular or rectangular. Each protective pad 3*a* has a height, measured perpendicularly to the free surface of the first semiconductor layer 91, that can be between 20 nm and 80 nm. When the protective pads 3*a* are cylindrical, they each have a diameter, measured in parallel to the free surface of the first semiconductor layer 91, which may be between 30 nm and 60 nm. When the protective pads 3*a* are parallelepipedal, they each have a diagonal that can be between 30 nm and 60 nm. In order to simplify the description, "diameter" will be used to designate both the diameter of the cylindrical pads and the diagonal of the parallelepiped pads.

In order to form the pillars 3 staggeredly with respect to the qubit array, it is advantageous to staggeredly dispose the protective pads 3*a* on the first semiconductor layer 91.

When the method is carried out on an SOI-type substrate, the qubit layer 2 thereby extends over the buried layer 92 (which is insulating) and more particularly between the plurality of pillars 3 and the buried layer 92.

FIG. 7 illustrates a first implementation of oxidising S2 the flank 33 of each pillar 33 and of the front face 2*a* of the qubit layer. Said oxidising S2 is carried out so as to form a continuous dielectric layer 4 of substantially constant thickness, i.e. constant to within 20% or even 10%. The dielectric layer 4 is formed at each flank 33 and on the front face 2*a* of the qubit layer 2.

The dielectric layer 4 has a first portion 41 which forms the spacer 41 over which the coupling rows 61 and the control rows 71 could extend. The spacer 41 extends over the front face 2*a* of the qubit layer 2 and surrounds the base 31 of each pillar 3. The spacer 41 is considered to be planar although it may slightly deviate from this definition at the base 31 of the pillars 3. On the other hand, the thickness of the spacer 41, measured perpendicularly to the front face 2*a*, is substantially constant and less than 10 nm.

The dielectric layer 4 has first portions 41, forming the flank dielectrics. Each pillar 3 is thus surrounded by a flank dielectric 41. Said oxidising S2 is preferably carried out by thermal oxidation. In this way, a flank dielectric 41 completely coats the flank of each pillar 3. Like the thickness of the spacer 42, the thickness of each flank dielectric 41, measured perpendicularly to the free surface, is preferably between 5 nm and 10 nm. Thermal oxidation forms an oxide of better quality than a deposited oxide. It is therefore advantageous to form the spacer 42 and flank dielectrics 41 in this way.

Thermal oxidation has the effect of transforming part of the semiconductor material of each pillar 3 into a dielectric material. The interface between the semiconductor material and the dielectric of each pillar 3 is not vertically aligned with the protective pad 3*a* but slightly recessed, closer to the centre of each pillar 3. The interface between the semiconductor material of a pillar 3 and the flank dielectric 41 is displaced by a distance of between 5 nm and 10 nm with respect to the vertical alignment of the protective pad 3*a*, towards the centre of said pillar 3. The withdrawal of the interface from the vertical alignment makes it possible to protect the semiconductor material of the pillar 3 during the subsequent steps of the method, especially the steps implementing anisotropic etching. Thus, the crystalline integrity of the pillar 3 and its crystalline properties are maintained. In addition, part of the flank dielectric 41 is masked by the protective pad 3*a* and is thus protected from subsequent etching steps. Thermal oxidation forms a better quality oxide, so it is advantageous to maintain such an oxide on the flank of each pillar 41.

On the other hand, the volume of oxidised material may increase during thermal oxidation, so that the free surface of each flank dielectric 41 may be distant from the vertical alignment of the protective pad 3*a* and slightly exposed with respect to said pad 3*a*. Thus, the following steps of the method, implementing anisotropic etching, may also etch the exposed portion of said flank dielectric 41.

The coupling rows and columns 61, 62, made in a second step, form with each flank dielectric 41, a gate at each pillar 3. It is therefore advantageous, in order to reduce variability of the circuits manufactured, to control thickness of each flank dielectric 41. It is easier to control thickness of each flank dielectric 41 during their formation, i.e. during the oxidation step S2, than during anisotropic etching.

One alternative implementation of the oxidation step S2 makes it possible to improve variability of the circuits 1 manufactured. According to this alternative, the oxidation step S2 comprises a first sub-step of oxidising the flank 33 of each pillar 3 so as to form, at the flank of each pillar 3, a first sacrificial dielectric layer. This sacrificial layer is also formed on the front face 2*a* of the qubit layer 2. Each first sacrificial dielectric layer is then removed in a second sub-step, preferably by isotropic etching, to release the free surface of each pillar 3. Finally, a third sub-step of oxidising S23 the newly freed surface of each pillar 3 thus makes it possible to form a final flank dielectric 41 at the flank 33 of each pillar 3. By virtue of etching of the first sacrificial layer and reoxidising S23 the flank of the pillars 3, the free surface of each flank dielectric 41 is vertically aligned with the protective pad 3*a*, or slightly recessed. Thus, the subsequent steps in the method, which may implement anisotropic etching, do not damage or thin the flank dielectrics 41. In this way, variability in the behaviour of the gates formed with the coupling rows and columns 61, 62 is reduced. In addition, reoxidising S23 also allows the final spacer 42 to be reformed on the front face 2*a* of the qubit layer 2.

The method comprises a step of forming S3 the coupling rows 61. The resulting structure is illustrated in FIG. 11. The coupling rows 61 are to apply an electrostatic field to each first portion of pillar 3 projecting from the spacer 42, for allowing or blocking passage of electrons in the pillar 3 to or from the qubit. For this, they advantageously form, with the flank dielectrics 41, a gate at a portion of the pillar 3. In order to improve coupling of each coupling row 61 with a pillar 3, it is preferable for each coupling row 61 to surround a first annular portion of the flank dielectric 33 of the pillar 3. For this, each coupling row 61 is in contact with the flank dielectric 41 surrounding at least one pillar 3. Preferably, each coupling row 61 is formed S3 to extend over the spacer 41 so as to surround a first annular portion of at least one flank dielectric 41 projecting from the spacer 41. Each coupling row 61 is in contact with at least one flank dielectric 41. Each coupling row 61 can also be in contact with a plurality of flank dielectrics 41. In this way, a coupling row 61 can apply an electrostatic field to several pillars 3. In combination with the coupling columns (described below), it enables each pillar 3 and therefore each qubit to be indexed independently. As the pillars 3 are staggeredly disposed, each coupling row 61 can contact several flank dielectrics 41 by extending along the Y-direction, coinciding with a row of pillars 3. FIG. 11 illustrates a 3D view of the pillars 3 and the coupling rows 61 obtained after their formation S3. The pillars are staggeredly arranged forming rows along the Y-direction and columns along the X-direction.

The method also comprises a step of forming S4 control rows 71. The resulting structure illustrated by FIG. 11 additionally comprises the control rows 71. In fact, the steps of forming S3, S4 the coupling rows 61 and control rows 71 can be carried out concomitantly in parallel. This is referred to as joint forming S3, S4. As a result, the coupling rows 61 and the control rows 71 extend in a same plane, in parallel to the front face 2*a* of the qubit layer 2, and directly against the spacer 42.

The control rows 71 are parallel to the coupling rows 61 and disposed between two consecutive coupling rows 61 along the X-direction. The control rows 71 are not in contact with the flank dielectrics 41 of the pillars 3, and are even distant from these dielectrics 41.

Jointly forming S3, S4 the coupling rows 61 and control rows 71 is detailed in FIGS. 8, 9 and 10. The formation step S3, S4 may comprise a first conformal deposition of a first conductive layer M1, for example of doped polycrystalline silicon or titanium nitride. The first depositing is preferably conformal and enables the spacer 42, the flank dielectrics 41 and the protective pads 3*a* to be completely covered. The first conductive layer M1 may have a thickness, measured perpendicularly to the dielectric layer 4, of between 10 nm and 15 nm. The forming step may comprise depositing a sacrificial dielectric layer F, for example of silicon oxide, so as to completely cover the assembly.

The joint forming step may also comprise etching the sacrificial dielectric layer F, as illustrated by FIG. 9, carried out anisotropically and selectively with respect to the first conductive layer M1. The first etch enables a plurality of portions CAP of the first conductive layer M1, referred to as "caps" to be stripped. Each cap CAP covers a protective pad 3*a* and an upper portion of a pillar 3. Etching the sacrificial dielectric layer F is stopped so as to leave a residual thickness of 10 nm to 15 nm, measured perpendicularly to the front face 2*a* of the qubit layer 2, at the base of each cap CAP.

The joint forming step may also comprise etching the first conductive layer M1 and the sacrificial dielectric layer F, as illustrated in FIG. 10, so as to remove the caps CAP as well as the residual thickness of the sacrificial dielectric layer F. The remaining first conductive layer M1 then extends over the spacer 42 and surrounds a first annular portion of each flank dielectric 41.

Etching of the first conductive layer M1 can be carried out in a single operation, for example by non-selective and isotropic etching, enabling the plurality of caps CAP and the residual thickness of the sacrificial dielectric layer F to be removed at the same time. The residual thickness of the sacrificial dielectric layer F is thereby advantageously chosen so that it is completely removed when the caps CAP are removed.

Etching can also be carried out in two sub-steps. A first sub-step comprising selectively etching the first conductive layer M1 with respect to the residual thickness of the sacrificial dielectric layer F so as to remove the caps CAP. A second sub-step comprising anisotropically etching the residual thickness of the sacrificial dielectric layer F so as to remove the sacrificial dielectric layer F. As it is not performed selectively, the second sub-step is stopped before substantially etching the first conductive layer M1.

In order to complete the coupling rows 61 and the control rows 71, as illustrated in FIG. 11, the joint forming step S3, S4 may comprise etching the first conductive layer M1 through a resin mask so as to obtain the coupling rows 61 and the control rows 71. The joint forming step S3, S4 may for example comprise, prior to said etching, photolithography of a resin mask on the first conductive layer M1, followed by etching the first conductive layer M1 through the resin mask so as to obtain coupling rows 61 and control rows 71. The coupling rows 61 and control rows 71 are preferably substantially parallel to each other and extend preferably along the Y-direction. By substantially parallel, it is meant within +30°, preferably within +20°, or even within +10°.

According to one alternative to etching the first conductive layer M1, only the caps CAP are removed, for example by selective etching. The residual thickness of the sacrificial dielectric layer F is then used to form a mask during the aforementioned photolithography sub-step and thus allow etching of the rows 61, 71 through said mask. The sacrificial dielectric layer F is removed, for example by selective etching, after the rows 61, 71 have been obtained.

FIG. 12 schematically shows a step S5 of depositing a first separation layer 51. The first separation layer 51 is deposited so as to cover the coupling 61 and control 71 rows, thus ensuring their electrical insulation. The first separation layer 51 can also be deposited so as to cover the spacer 42. Depositing S5 the first separation layer 51 is advantageously made from silicon oxide $SiO_2$. For this, the first separation layer 51 can be firstly deposited so as to completely cover the pillars 3 thus as well as the protective pads 3*a*. Flattening and anisotropically etching the first separation layer 51 make it possible to control thickness of said layer 51. Flattening, for example by mechanical and/or chemical polishing, stops at the top of the protective pads 3*a*. Etching the first separation layer 51 flattened is stopped before reaching the coupling 61 and control 71 rows. The final thickness of the first separation layer 51, measured perpendicularly to the front face 2*a* and from the spacer 42, is then preferably between 20 nm and 40 nm. Thus, at least one first portion of each pillar 3 protrudes from the first separation layer 51. Depositing S5 can be carried out by chemical vapour deposition (CVD) and/or plasma-enhanced chemical vapour deposition. At the end of said deposition step, the first separation layer 51 covers the coupling 61 and control 71 rows.

The thickness of the first separation layer 51 is preferably chosen so that at least one portion of each pillar 3 protrudes from the first separation layer 51.

FIGS. 13 to 15 illustrate the step S6 of forming coupling columns 62. In the same way as the coupling rows 61, the coupling columns 62 advantageously form, with the flank dielectrics 41, a gate at each pillar 3. The coupling rows and columns 61, 62 are thus designed to apply an electrostatic field to two distinct portions of a same pillar 3, allowing or blocking passage of electrons into said pillar 3. The coupling rows and columns 61, 62 are arranged so that applying an electric potential to one of the rows 61 and one of the columns 62 makes it possible to allow or block the passage of electrons from a single pillar 3 out of the plurality of pillars 3. The coupling rows and columns 61, 62 thus allow individual indexing of the qubits to, for example, initialise or measure their state.

It is thus also advantageous that the coupling of each coupling column 62 with the pillars 3 is reproducible and maximal. It is thus preferable that the coupling columns 62 surround, in the same way as the coupling rows 61, an annular portion of a flank dielectric 41 of a pillar 3. For this, each coupling column 62 is in contact with at least one flank dielectric 41. Preferably, each coupling column 62 is formed S6 so as to surround an annular portion of at least one flank dielectric 41, protruding from the first separation layer 51.

The coupling columns 62 advantageously extend over the first separation layer 51. They thus extend in parallel to the front face 2*a* of the qubit layer 2. The first separation layer 51, covering the coupling 61 and control 71 rows, ensures electrical isolation between the rows and columns 61, 71, 62. However, there may still be capacitive coupling between the rows and the columns 61, 71, 62. In order to reduce capacitive coupling, it is advantageous for the coupling columns 62 to be designed so as to cross the coupling rows 61 and the control rows 71 at substantially right angles. By substantially right angles, it is meant being right to within ±30°, preferably to within ±20°, or even to within ±10°.

Thus, the coupling columns 62 preferentially extend in parallel to each other and along the X-direction. Thus, they can contact the flank dielectrics 41 of a plurality of pillars 3 aligned along the X-direction and reduce capacitive coupling with the coupling 61 and control 71 rows.

As the pillars 3 are staggeredly arranged an forming rows and columns along the Y-direction and the X-direction respectively, the coupling columns 62 are preferably oriented perpendicularly to the coupling rows 61. It is however contemplatable for the coupling columns 62 to form another angle with the coupling rows 61, for example equal to 45°. In this case, the second conductive electrodes 62 are referred to as "coupling diagonals".

The step of forming S6 the coupling columns 62 is preferably similar to the step of forming S3 the coupling rows 61 as illustrated by FIGS. 8 to 10. It involves depositing a second metal layer M2 so as to form caps CAP on the pillars 3. Employing a sacrificial dielectric layer F then makes it possible to remove the caps CAP in two stages and form the columns 62.

FIG. 16 illustrates the step S7 of depositing a second separation layer 52. Said second separation layer 52 rests on the plurality of coupling columns 62 and coats said plurality of columns 62. Depositing S7 the second separation layer 52 can be carried out in the same way as depositing S5 the first separation layer 51. The second separation layer 52 can also be made from silicon oxide $SiO_2$. The second separation layer 52 coats the coupling columns 62 and can also cover the first separation layer 51. Thus, the second separation layer 52 has a thickness, measured from the first separation layer 51, of between 20 nm and 40 nm.

The thickness of the second separation layer 52 is configured so that a portion of each pillar 3 protrudes from said second separation layer 52. In this way, a third annular portion of each flank dielectric 41, surrounding each pillar 3, also protrudes from said second layer 52. This annular portion then extends over the entire height of the pillar 3 protruding from the second layer 52, i.e. from the free surface of the second layer 52 to the head 32 of each pillar 3, thus being flush with the protective pads 3*a* placed on each pillar 3. The thickness of the second separation layer 52 and/or the height of each pillar 3 is chosen so that the height of the portion protruding from the separation layer 52 is between 5 nm and 20 nm inclusive, for example 10 nm.

In order to adjust thickness of the second separation layer 52, it may firstly be deposited so as to protrude beyond the top of the protective pads 3*a*. Secondly, it can be flattened until it is flush with the top of the protective pads 3*a*. Finally, the second separation layer 52 can be anisotropically etched in order to strip the protective pads 3*a* and the annular portions of each flank dielectric 41.

FIGS. 17 to 18 illustrate forming S8 the read rows 81. Each read row 81 formed is preferably in contact with the semiconductor material of a pillar 3. In order to obtain proper electrical contact between the read rows and the pillars 3, it is advantageous for each read row 81 to be in contact with a dedicated contact surface for each pillar 3. In the example of FIG. 17, the read rows 81 extend along the Y-direction and connect a contact surface of a plurality of pillars 3. Each read row 81 may also be in contact with the flank of a protective pad 3*a*. In the example of FIGS. 17 to 18, the read rows 81 extend over the second separation layer 52 and cover each protective pad 3*a*.

In order to reduce capacitive coupling between the coupling columns 62 and the read rows 81, the latter are advantageously oriented perpendicularly to the coupling columns 62.

Forming S8 the read rows 81 may comprise, firstly, removing the free flank dielectric 41 protruding from the second separation layer 52, as illustrated by FIG. 17.

This removing comprises, for example, etching the annular portions of each flank dielectric 41 protruding from the second separation layer 52, so as to strip an annular portion 330 at the head 32 of each pillar 3. This annular portion 330 may also be referred to as "contact surface". The contact surface 330 may be used to electrically connect the pillar 3 to a read electrode 81 for reading the state of the qubit located vertically aligned with said pillar 3.

Etching the flank dielectric 41 is preferably carried out so as to remove them completely. For this, said etching may be performed selectively, at least with respect to the protective pads 3*a*. When the flank dielectrics 41 are comprised of SiO2, etching can be carried out using dilute hydrofluoric acid HF.

Forming S8 the read rows 81 may comprise, secondly, depositing a third conductive layer M3, in contact with the contact surface 330 of each pillar 3 and on the second separation layer 52, as illustrated by FIG. 18. The third conductive layer M3 may be between 10 nm and 15 nm thick. The third conductive layer M3 can be made from doped polycrystalline silicon. Its deposition may be preceded by epitaxially growing Si:P phosphorus-doped silicon or SiGe:B boron-doped silicon and germanium. In this way, the interface between the contact surface 330 of each pillar 3 and the third conductive layer M3 is improved.

Forming S8 the read rows 81 may also comprise structuring the third conductive layer M3 so as to obtain each read row 81 as illustrated in FIG. 19. Structuring the third conductive layer M3 can be carried out by photolithography of a resin mask through which the third conductive layer M3 is etched. Structuring is preferably carried out so as to form read rows 81 substantially parallel to each other.

By substantially parallel, it is meant parallel to within ±30°, preferably ±20° or even ±10°. It is also carried out so as to dispose two read rows 81 on either side of a pillar 3, each of the rows being at least in contact with the contact surface 330 of said pillar 3. The read rows 81 illustrated in FIG. 19 also comprise a plurality of transverse portions 810 completely covering the protective pads 3*a* and the contact surfaces 330 of the pillars 3. The transverse portions 810 appear when the photolithographed resin mask includes portions above each pillar 3, protecting the latter during etching and avoiding removal of the third conductive layer M3 from the flanks of the protective pads 3*a* and the contact surfaces 330.

Structuring the third conductive layer M3 can also be carried out in a self-aligned manner, without the need for transverse portions 810. Etching the third conductive layer M3 is, for example, anisotropically performed through a photolithographed resin mask comprising no portions above each pillar 3. The topology of each pillar 3 has the effect of forming flanks of third conductive layer M3 around each pillar 3.

FIGS. 20 to 28 illustrate forming S9 the charging gates 82 and forming S10 the control vias 72. These forming S9, S10 operations are preferably simultaneously carried out.

They comprise, firstly, depositing a third separation layer 53 and the planarizing the third separation layer 53, as illustrated by FIG. 20. Depositing the third separation layer 53 is carried out so as to cover the entire structure, especially the read rows 81 and preferably the second separation layer 52 and the protective pads 3*a* when these are not covered with read rows 81. The third separation layer 53 can be made from silicon oxide. The third separation layer 53 is then flattened until the top of the protective pads 3*a* is released. During this step, part of each read row 81 can be removed, especially when the latter cover the protective pads 3*a*. By proceeding in this way, each protective pad 3*a* emerges from the surface of the third separation layer 53.

The third separation layer 53, together with the second and first separation layers 52, 51, forms an insulating layer 5.

Forming the charging gates 82 and the vias 72 also comprises depositing a hard mask HM, for example made of SiN, and an encapsulation material PMD, for example made of $SiO_2$.

FIGS. 21 and 22 illustrate selectively etching the protective pads 3*a* with respect to the third separation layer 53 and with respect to the read rows 81. It firstly comprises forming first trenches T1 in the hard mask HM and the encapsulation material PMD. These first trenches T1 are formed, for example by etching, so as to reach the top of the protective pads 3*a*. The first trenches T1 are oriented perpendicularly to the coupling rows 62, i.e. along the X-direction in FIG. 21. They are also arranged vertically aligned with a row of pillars 3 aligned along the X-direction.

The protective pads 3*a* are etched by virtue of the clearance provided by the first trenches T1. It can be carried out isotropically. It is preferably stopped at the top 32 of each pillar 3, revealing the semiconductor material of each pillar 3. Etching the protective pads 3*a* thus makes it possible to form a plurality of first cavities C1, or wells, vertically aligned with each pillar 3. Each first cavity C1 comprises edges which are preferably formed by a read row 81. Each first cavity C1 at the head 32 of the pillars 3 is to accommodate a charging gate 82 for forming, with a pillar 3 and a read row 81, a single-electron transistor.

FIGS. 23 to 26 illustrate intermediate steps for preparing formation of vias 72. The purpose of these steps is to form second cavities C2 into which the vias 72 will be deposited.

Firstly, the first trenches T1 and the first cavities C1, previously emptied, are filled with a first protective resin P1 so as to completely cover the encapsulation material PMD, as illustrated by FIG. 23. Second trenches T2 are made in the protective resin and in the encapsulation material PMD so as to expose part of the layer of hard mask HM. These second trenches T2 are made, for example, by anisotropic etching, said etching being stopped at the hard mask HM. The second trenches T2 are also oriented perpendicularly to the coupling rows 61, i.e. along the X-direction. They are arranged so that they are equidistant from two consecutive coupling columns 62. Thus, they cross the coupling rows 61 but the coupling columns 62.

Secondly, the first protective resin P1 is selectively removed with respect to the encapsulation material PMD, the hard mask HM and the read rows 81. The first and second trenches T1, T2 are free and the first cavities C1 vertically aligned with the pillars 3 too.

FIGS. 25 and 26 show etching second cavities C2 in two stages. Firstly, a second protective resin P2 is deposited so as to completely cover the encapsulation material PMD, as illustrated in FIG. 25. The first cavities C1 and the first and second trenches T1, T2 are filled with the second protective resin P2.

Intermediate cavities C2' are then formed, for example by etching, in the second protective resin P2. These intermediate cavities C2' are etched until they reach the hard mask HM. Each intermediate cavity C2' is disposed vertically aligned with a coupling row 61.

The second cavities C2 are formed by complementary etching, starting from the bottom of the intermediate cavities C2', i.e. from the hard mask HM, until they reach the front face 2*a* of the qubit layer 2. The second cavities C2 are etched through the insulating layer 5, through a coupling row 61 and through the spacer 42. The diameter of the second cavities C2 is chosen so as not to intersect the coupling rows 61. The width of the coupling rows 61 can also be dimensioned to allow for etching of the second cavities C2. For example, they have a widening at the place where a second cavity C2 is to be formed.

The second protective resin P2 is then removed, leaving the first and second trenches T1, T2 and the first and second cavities C1, C2 free, as illustrated in FIG. 26.

The control vias 72 form a gate at the qubit layer 2, so as to be able to modulate electric field in the qubit layer 2 without making electrical contact. FIG. 27 shows a step common forming S9, S10 the charging gates 82 and control vias 72 in the first and second cavities C1, C2 respectively. This comprises, for example, depositing an oxide or dielectric on the walls forming the first or second cavities C1, C2 so as to form a layer of oxide 724 referred to as "gate oxide". Alternatively, it comprises oxidation of the walls forming the first and second cavities C1, C2, so as to form the gate oxide 724. The gate oxide 724 is preferably formed by thermal oxidation and advantageously has a thickness of between 2 nm and 5 nm.

The gate oxide 724 also makes it possible to electrically insulate the vias 72 and the charging gates from the coupling rows 61 and upon read rows 81 respectively.

The first and second cavities C1, C2 are then filled with a conductive material as illustrated in FIG. 28 so as to form the charging gates 82 and the vias 72.

The conductive material is, for example, a metal or an assembly of metal layers. Filling each cavity C1, C2 comprises for example conformally depositing a first metal layer, for example titanium Ti, so as to cover the gate oxide at the bottom of each cavity C1, C2. Filling the cavities C1, C2 may also comprise conformally depositing titanium nitride TiN, so as to cover the first metal layer. Finally, filling may comprise depositing a second metal layer, for example of tungsten W, covering the silicide layer and completely filling each cavity C1, C2.

The conductive material is preferably flattened until it reaches the encapsulation material PMD. Thus, the charging gates 82 and the vias 71 are electrically disconnected.

The control vias 72 thus have a base 721 whose distance from the front face 2*a* of the qubit layer 2 is controlled by the gate oxide 724.

The charging gates 82 thus formed can be structured so as to connect a plurality of single-electron transistors. Advantageously, they are substantially parallel to each other and oriented according to one of the X, Y-directions. In this way, the charging gates 82 can control a plurality of pillars 3. However, in order to reduce capacitive coupling between the read rows 81 and the charging gates 82, the latter are advantageously oriented perpendicularly to the read rows 81.

The invention claimed is:

1. A quantum electronic circuit comprising:
- a semiconductor layer for receiving qubits forming a qubit layer, having a first face forming a front face;
- semiconductor pillars, distant from each other, extending perpendicularly to the front face of the qubit layer from the qubit layer, each semiconductor pillar comprising a first end forming a base, in contact with the front face of the qubit layer;
- dielectric layers forming flank dielectrics, each flank dielectric surrounding the flank of one of the semiconductor pillars;
- a dielectric layer forming a spacer extending in contact with the front face of the qubit layer and surrounding the base of each semiconductor pillar;
- first and second conductive electrodes forming coupling rows and coupling columns respectively, to modulate electrostatic potential in the semiconductor pillars:
  - the coupling rows being parallel to each other and extending in parallel to the front face of the qubit layer, each coupling row being in contact with the flank dielectric of at least one of the semiconductor pillars;
  - the coupling columns being parallel to each other and perpendicular to the coupling rows, extending in parallel to the front face of the qubit layer and distant from the coupling rows, each coupling column being in contact with the flank dielectric of at least one of the semiconductor pillars;
- wherein the quantum electronic circuit also comprises third conductive electrodes forming control rows, and conductive vias forming control vias, to modulate electrostatic potential at the qubit layer and forming quantum dots in the qubit layer:
- the control rows being parallel to each other and parallel to the coupling rows and extending over the spacer, each control row being distant from the coupling rows , the coupling columns and the flank dielectrics of the semiconductor pillars; and
- the control vias being distant from the coupling columns, the control rows and the flank dielectrics of the semiconductor pillars, each of the control vias extending perpendicularly to the front face of the qubit layer, each via having a first end disposed in proximity to the front face of the qubit layer, without electrical contact with the qubit layer.

2. The circuit according to the claim 1, wherein the first end of each via is disposed less than 15 nm from the front face of the qubit layer.

3. The circuit according to claim 1, wherein the thickness of the spacer is less than 15 nm.

4. The circuit according to claim 1, wherein each control row is disposed between two consecutive coupling rows and each control via is disposed between two consecutive coupling columns.

5. The circuit according to claim 1, wherein each of the control vias passes through one of the coupling rows, without electrical contact.

6. The circuit according to claim 5, wherein each coupling row extends over the spacer.

7. The circuit according to claim 1, wherein the coupling rows and the control rows extend in a first plane, parallel to the first face of the qubit layer, wherein the coupling columns extend in a second plane also parallel to the first face of the qubit layer, the first plane being disposed between the first face of the qubit layer and the second plane.

8. The circuit according to claim 1, wherein each via has a second end opposite to the first end, the second ends of a plurality of vias being electrically connected together.

9. The circuit according to claim 1, wherein each semiconductor pillar comprises a second end forming a head, opposite to the base, the head of the semiconductor pillar comprises a contact surface not surrounded by the flank dielectric.

10. The circuit according to claim 9, wherein the circuit also comprises fourth electrodes read rows, each read row being in contact with the contact surface of at least one of the semiconductor pillars.

11. The circuit according to claim 9, wherein the circuit also comprises gate structures forming charging gates, each charging gate being in contact with the head of at least one of the semiconductor pillars.

12. A method for manufacturing a quantum electronic circuit, the method being implemented from a substrate comprising a first single crystal semiconductor layer and comprising:

forming, from the first semiconductor layer, semiconductor pillars distant from each other, each semiconductor pillar having a first end forming a base; and a semiconductor layer for receiving qubits forming a qubit layer, at the base of each semiconductor pillar, the qubit layer having a first face forming a front face;

oxidising the flank of each semiconductor pillar and the front face of the qubit layer so as to form a first dielectric layer comprising first portions forming flank dielectrics, each flank dielectric surrounding the flank of one of the semiconductor pillars, and a second portion forming a spacer, extending in contact with the front face of the qubit layer and surrounding the base of each semiconductor pillar;

forming first conductive electrodes forming coupling rows, to modulate electrostatic potential in the semiconductor pillars, the coupling rows being parallel to each other and extending in parallel to the front face of the qubit layer, each coupling row being in contact with the flank dielectric of at least one of the semiconductor pillars;

forming third conductive electrodes forming control rows, to modulate electrostatic potential in the qubit layer, the control rows being parallel to each other and parallel to the coupling rows and extending over the spacer, each control row being distant from the coupling rows and the flank dielectrics of the semiconductor pillars;

forming second conductive electrodes forming coupling columns, to modulate electrostatic potential in the semiconductor pillars, the coupling columns being parallel to each other and perpendicular to the coupling rows, extending in parallel to the front face of the qubit layer and distant from the coupling rows and the control rows, each coupling column being in contact with the flank dielectric of at least one of the semiconductor pillars;

forming conductive vias forming control vias, to modulate electrostatic potential in the qubit layer and forming, with the control rows, quantum dots in the qubit layer, the control vias being distant from the coupling columns, the control rows and the flank dielectrics of the semiconductor pillars, each of the control vias extending perpendicularly to the front face of the qubit layer from the spacer and passing through one of the coupling rows, without electrical contact.

13. The manufacturing method according to claim 12, wherein the coupling rows and the control rows are simultaneously formed.

* * * * *